(12) United States Patent
Hayashi

(10) Patent No.: US 10,930,615 B2
(45) Date of Patent: Feb. 23, 2021

(54) SEMICONDUCTOR DEVICE AND METHOD OF MANUFACTURING SEMICONDUCTOR DEVICE

(71) Applicant: ROHM CO., LTD., Kyoto (JP)

(72) Inventor: Taro Hayashi, Kyoto (JP)

(73) Assignee: ROHM CO., LTD., Kyoto (JP)

(*) Notice: Subject to any disclaimer, the term of this patent is extended or adjusted under 35 U.S.C. 154(b) by 0 days.

(21) Appl. No.: 16/406,461

(22) Filed: May 8, 2019

(65) Prior Publication Data
US 2019/0348391 A1    Nov. 14, 2019

(30) Foreign Application Priority Data
May 10, 2018 (JP) .............................. JP2018-091208

(51) Int. Cl.
| H01L 23/00 | (2006.01) |
| H01L 21/56 | (2006.01) |
| H01L 21/78 | (2006.01) |
| H01L 23/31 | (2006.01) |

(52) U.S. Cl.
CPC ............ *H01L 24/49* (2013.01); *H01L 21/563* (2013.01); *H01L 21/78* (2013.01); *H01L 23/3107* (2013.01); *H01L 24/33* (2013.01); *H01L 2924/01029* (2013.01)

(58) Field of Classification Search
CPC ....... H01L 24/49; H01L 24/33; H01L 21/563; H01L 21/78; H01L 23/3107; H01L 2924/01029; H01L 2224/16238; H01L 24/16; H01L 2224/97; H01L 2224/13; H01L 2224/0554; H01L 2224/05573; H01L 23/49805; H01L 21/561; H01L 23/3121
See application file for complete search history.

(56) References Cited

U.S. PATENT DOCUMENTS

| 5,369,220 A * | 11/1994 | Harada | ................. H01L 23/142 174/257 |
| 2009/0095974 A1 | 4/2009 | Taguchi et al. | |
| 2015/0029689 A1* | 1/2015 | Imafuji | ................. H05K 1/181 361/767 |

FOREIGN PATENT DOCUMENTS

JP        2009-94409        4/2009

* cited by examiner

*Primary Examiner* — Syed I Gheyas
(74) *Attorney, Agent, or Firm* — Hamre, Schumann, Mueller & Larson, P.C.

(57) ABSTRACT

Semiconductor device includes: substrate having substrate main surface and substrate rear surface facing opposite sides to each other in first direction, and substrate side surface facing in second direction orthogonal to the first direction; wiring layer having main surface electrode covering a portion of the substrate main surface, and side surface electrode connected to the main surface electrode and covering a portion of the substrate side surface; semiconductor element electrically connected to the main surface electrode and mounted on the substrate to face the substrate main surface; and sealing resin having resin side surface facing in the same direction as the substrate side surface, and covering the semiconductor element and the main surface electrode, wherein the side surface electrode has side exposed surface exposed from the sealing resin and facing in the same direction as the substrate side surface, the side exposed surface being flush with the resin side surface.

11 Claims, 29 Drawing Sheets

FIG. 5
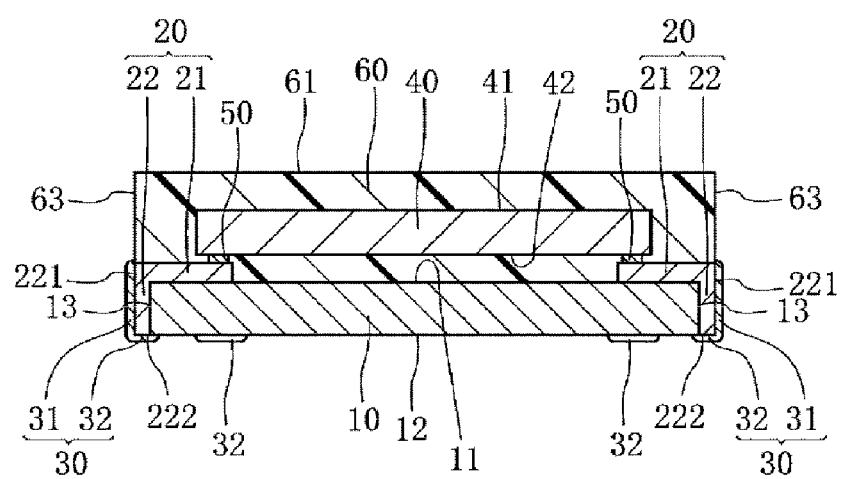
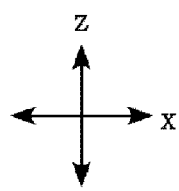

FIG. 6
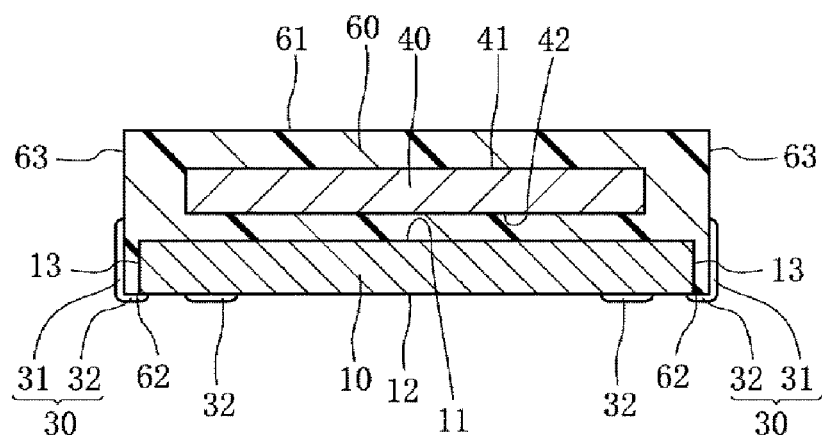
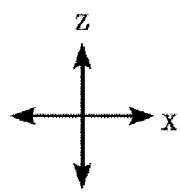
FIG. 7
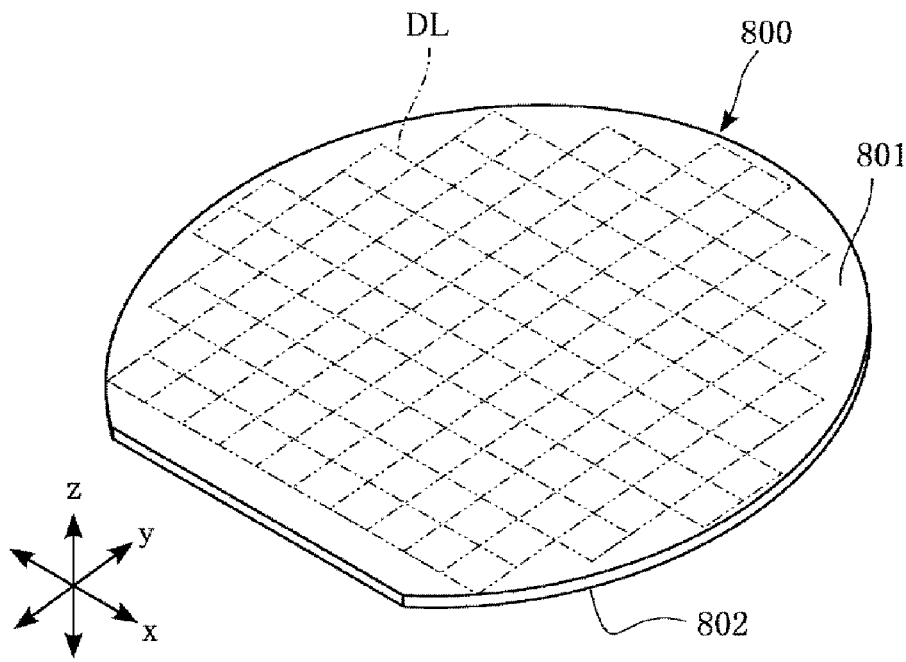

FIG. 25
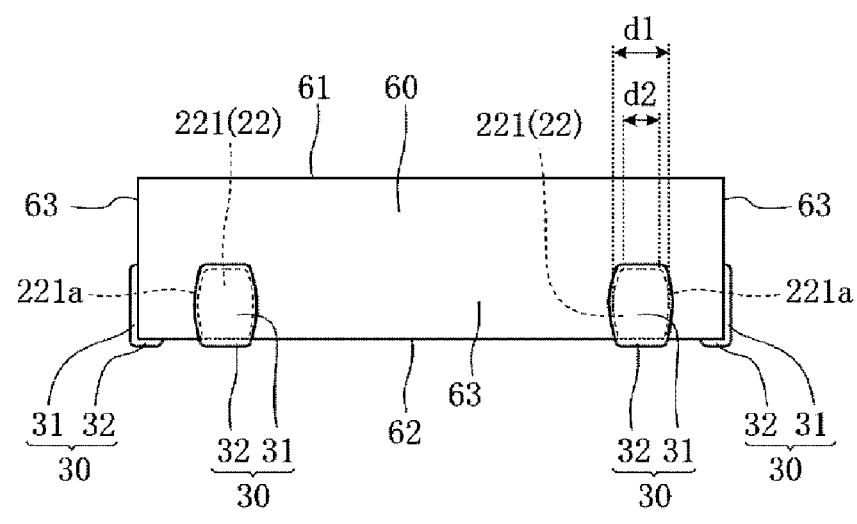
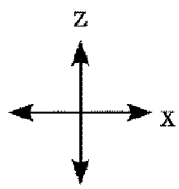

FIG. 30
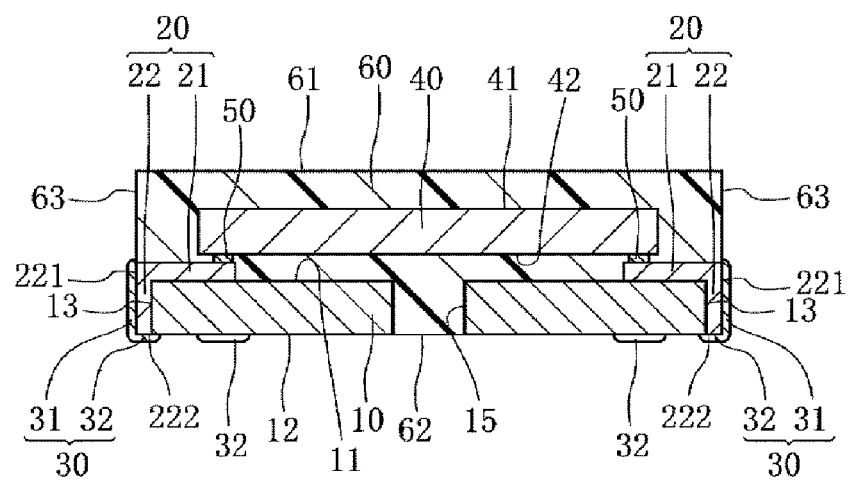
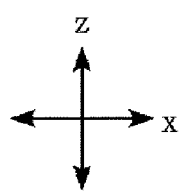

SEMICONDUCTOR DEVICE AND METHOD OF MANUFACTURING SEMICONDUCTOR DEVICE

CROSS-REFERENCE TO RELATED APPLICATION

This application is based upon and claims the benefit of priority from Japanese Patent Application No. 2018-091208, filed on May 10, 2018, the entire contents of which are incorporated herein by reference.

TECHNICAL FIELD

The present disclosure relates to a semiconductor device having a semiconductor element mounted thereon, and a manufacturing method thereof.

BACKGROUND

Recently, a so-called micro-machine (micro electro mechanical systems: MEMS), in which a silicon (Si) substrate is microfabricated and various semiconductor elements are mounted on the Si substrate, has become popular. For example, a conventional semiconductor device is disclosed in which a semiconductor element is mounted on an Si substrate in the related art. The semiconductor device described in the related art includes an Si substrate (base), a semiconductor element (light emitting element), and a wiring layer (wiring pattern). The semiconductor element is mounted on the Si substrate. The wiring layer is formed on the Si substrate and is electrically connected to the semiconductor element. The wiring layer serves as a terminal when the semiconductor device is mounted on a circuit board of an electronic device or the like. The wiring layer is formed on a top surface of the Si substrate.

The conventional semiconductor device configured as described above is manufactured as follows. That is, in a conventional method of manufacturing a semiconductor device, after the wiring layer is formed on an Si wafer, a plurality of semiconductor elements is mounted on the Si wafer. Then, the Si wafer is diced to divide the Si wafer into individual pieces of semiconductor elements. In this manner, the conventional semiconductor device is manufactured.

In the conventional method of manufacturing a semiconductor device, since dicing is performed on the individual pieces of semiconductor elements after forming the wiring layer, the wiring layer is not formed on a side surface of the Si substrate formed by dicing. Therefore, when the semiconductor device is mounted on the circuit board of the electronic device or the like using solder, it has been necessary to use an X-ray inspection apparatus or the like in order to confirm the bonding state of the solder.

SUMMARY

Some embodiments of the present disclosure provide a semiconductor device capable of easily and visually confirming a bonding state of solder when it is mounted on a circuit board of an electronic device or the like, and a method of manufacturing the semiconductor device.

According to an aspect of the present disclosure, there is provided a semiconductor device, which includes: a substrate having a substrate main surface and a substrate rear surface facing opposite sides to each other in a first direction, and a substrate side surface facing in a second direction orthogonal to the first direction; a wiring layer having a main surface electrode covering a portion of the substrate main surface, and a side surface electrode connected to the main surface electrode and covering a portion of the substrate side surface; a semiconductor element electrically connected to the main surface electrode and mounted on the substrate so as to face the substrate main surface; and a sealing resin having a resin side surface facing in the same direction as the substrate side surface, and covering the semiconductor element and the main surface electrode, wherein the side surface electrode has a side exposed surface exposed from the sealing resin and facing in the same direction as the substrate side surface, and wherein the side exposed surface and the resin side surface are flush with each other.

In some embodiments, the side surface electrode may have a rear exposed surface exposed from the sealing resin and facing in the same direction as the substrate rear surface, and the rear exposed surface and the substrate rear surface may be flush with each other In some embodiments, the device may further include an external plating including a side surface coating part configured to cover the side exposed surface.

In some embodiments, the external plating may further include a rear surface coating part connected to the side surface coating part and configured to cover the rear exposed surface and a portion of the substrate rear surface In some embodiments, the external plating may include an Ni layer, a Pd layer, and an Au layer stacked on each other.

In some embodiments, the substrate may include a groove which penetrates from the substrate main surface to the substrate rear surface and is filled with the sealing resin.

In some embodiments, the side surface electrode may have a curved edge extending in the first direction as viewed in the second direction.

In some embodiments, the wiring layer may include an underlayer and a plating layer stacked on each other.

In some embodiments, a main component of the wiring layer may be copper.

In some embodiments, the device may further include a conductive binder interposed between the main surface electrode and the semiconductor element.

In some embodiments, a main component of the substrate may include an intrinsic semiconductor material.

In some embodiments, the intrinsic semiconductor material may be silicon.

According to another aspect of the present disclosure, there is provided a method of manufacturing a semiconductor device, which includes: providing a substrate having a substrate main surface and a substrate rear surface facing opposite sides to each other in a first direction; forming a groove portion recessed in the first direction from the substrate main surface in the substrate; forming a wiring layer having a main surface electrode covering a portion of the substrate main surface, and an in-groove conductor connected to the main surface electrode and covering at least a portion of the groove portion; mounting a semiconductor element electrically connected to the main surface electrode such that the semiconductor element faces the substrate main surface; forming a sealing resin covering the semiconductor element and the main surface electrode; and cutting the sealing resin and the in-groove conductor to form a resin side surface facing in a second direction orthogonal to the first direction in the sealing resin, expose the in-groove conductor from the sealing resin, and form a side surface electrode having a side exposed surface facing in the same direction as the resin side surface, wherein the side exposed surface is flush with the resin side surface.

In some embodiments, the method may further include, before the act of cutting the sealing resin and the in-groove conductor: grinding the substrate from a substrate rear surface side to expose the in-groove conductor from the substrate rear surface.

In some embodiments, the act of cutting the sealing resin and the in-groove conductor may be performed by blade dicing, and a dicing blade having a thickness smaller than a width of the groove portion may be used in the blade dicing.

In some embodiments, the side surface electrode may have a rear exposed surface facing in the same direction as the substrate rear surface in the first direction, and the rear exposed surface and the substrate rear surface may be flush with each other.

In some embodiments, the method may further include forming an external plating including a side surface coating part configured to cover the side exposed surface.

In some embodiments, the external plating may further include a rear surface coating part connected to the side surface coating part and configured to cover the rear exposed surface and a portion of the substrate rear surface, and the act of forming the external plating may include forming the rear surface coating part together with the side surface coating part.

BRIEF DESCRIPTION OF DRAWINGS

FIG. 5 is a cross-sectional view taken along line V-V in FIG. 2.

FIG. 6 is a cross-sectional view taken along line VI-VI in FIG. 2.

FIG. 7 is a perspective view illustrating one process of a method of manufacturing a semiconductor device according to the first embodiment.

FIG. 25 is a side view illustrating the semiconductor device according to an exemplary modification of the first embodiment.

FIG. 30 is a cross-sectional view illustrating the semiconductor device according to the third embodiment, which is a cross section taken along line XXX-XXX in FIG. 29.

DETAILED DESCRIPTION

Figure 1:
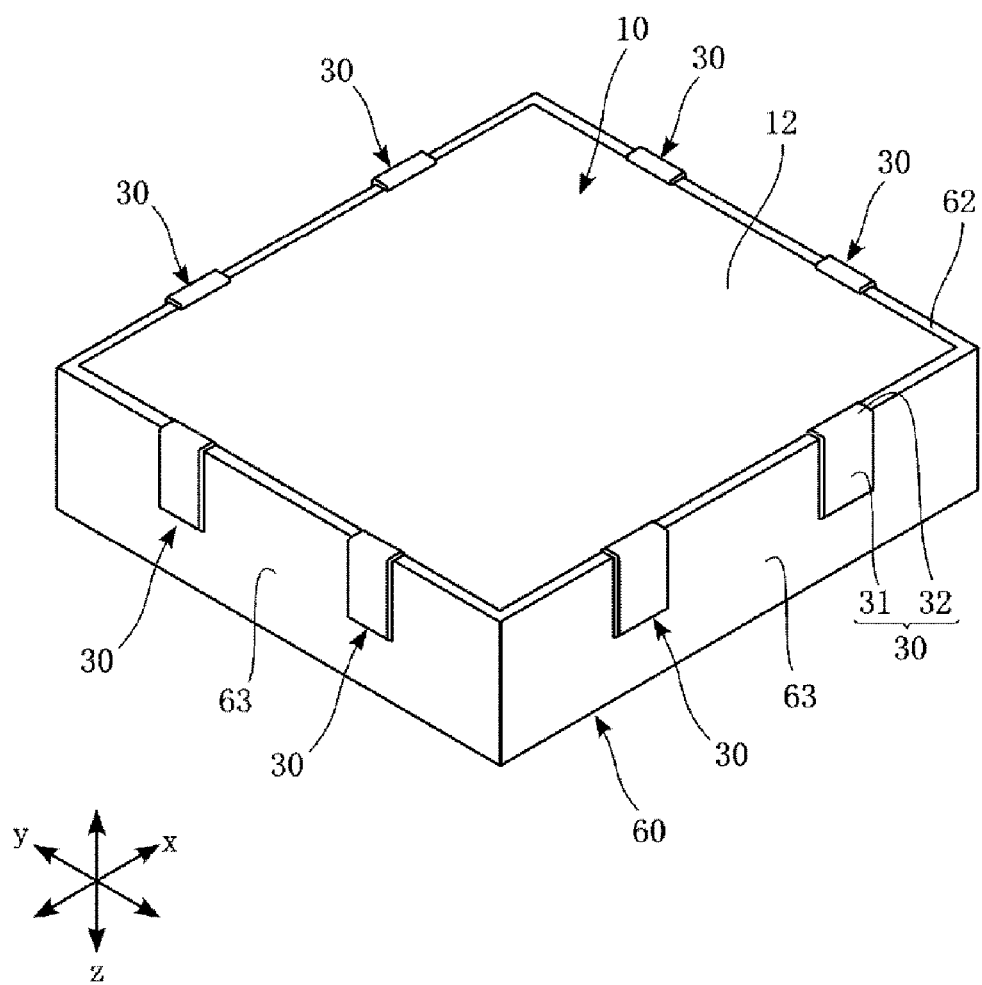
FIG. 1 is a perspective view (a perspective view seen from the bottom side) illustrating a semiconductor device according to a first embodiment of the present disclosure.

Embodiments of a semiconductor device of the present disclosure and a method of manufacturing a semiconductor device of the present disclosure will now be described with reference to the drawings.

FIGS. 1 to 6 illustrate a semiconductor device according to a first embodiment of the present disclosure. A semiconductor device A1 of the first embodiment includes a substrate 10, wiring layers 20, external platings 30, a semiconductor element 40, a conductive binder 50, and a sealing resin 60.

Figure 2:
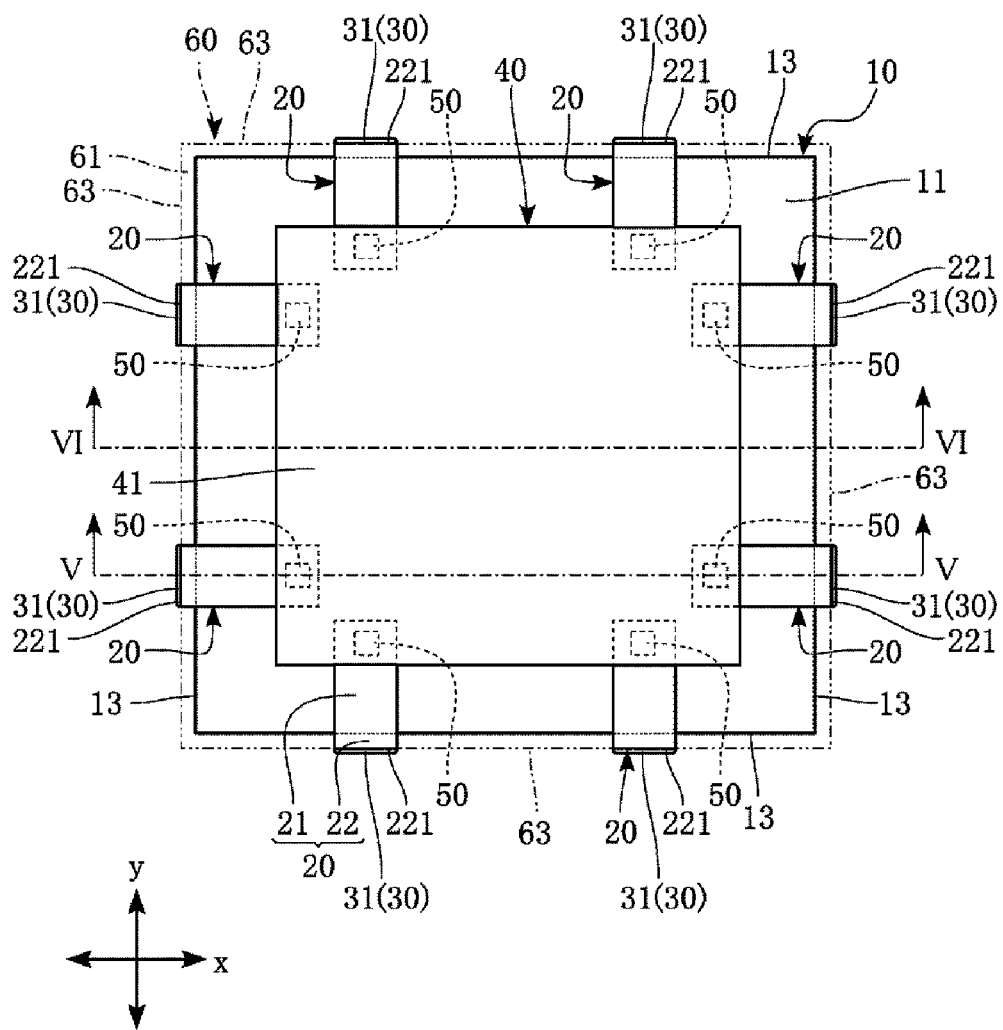
FIG. 2 is a plan view illustrating the semiconductor device according to the first embodiment.
Figure 3:
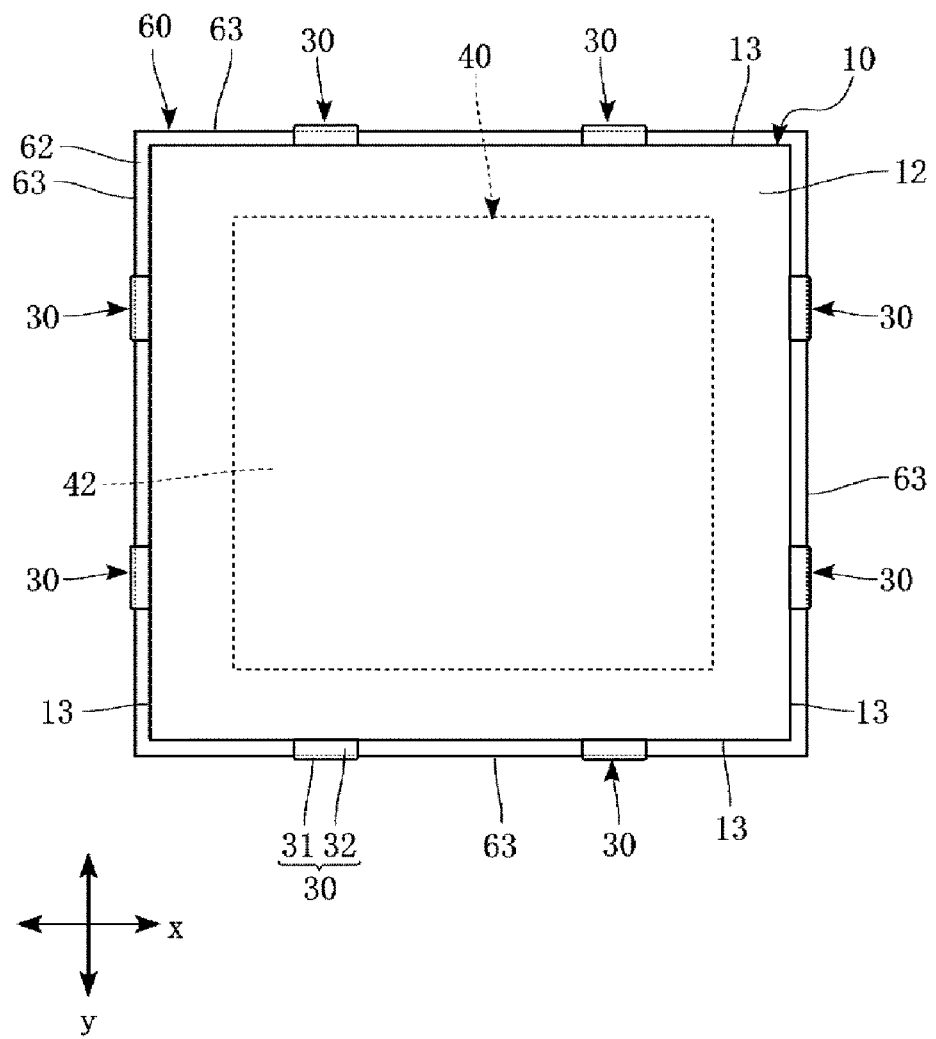
FIG. 3 is a bottom view illustrating the semiconductor device according to the first embodiment.
Figure 4:
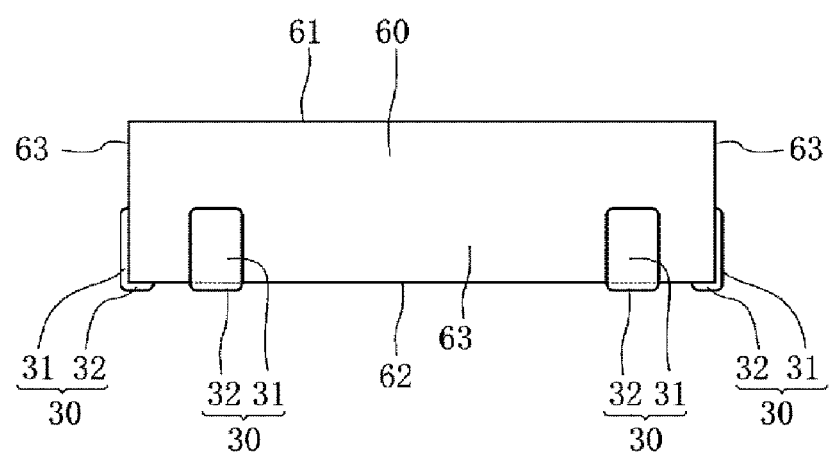
FIG. 4 is a side view illustrating the semiconductor device according to the first embodiment.

FIG. 1 is a perspective view illustrating the semiconductor device A1, and illustrates a state as viewed from the bottom side. FIG. 2 is a plan view illustrating the semiconductor device A1, and illustrates the sealing resin 60 by an imaginary line (two-dot chain line). FIG. 3 is a bottom view illustrating the semiconductor device A1. FIG. 4 is a side view (front view) illustrating the semiconductor device A1. FIG. 5 is a cross-sectional view taken along line V-V in FIG. 2. FIG. 6 is a cross-sectional view taken along line VI-VI in FIG. 2. For convenience of description, in these drawings, three directions orthogonal to each other are defined as an x direction, a y direction, and a z direction, respectively. The x direction is a lateral direction in the plan view (see FIG. 2) of the semiconductor device A1. They direction is a vertical direction in the plan view (see FIG. 2) of the semiconductor device A1. The z direction is a thickness direction of the semiconductor device A1. The x direction and the z direction respectively correspond to a "second direction" and a "first direction" described in the claims.

The semiconductor device A1 is a device that is surface-mounted on a circuit board of various electronic devices or the like. The semiconductor device A1 is of a leadless package type in which the terminals for mounting on the circuit board do not protrude from the sealing resin 60, particularly a QFN package type in which the terminals are arranged on respective side surfaces of the sealing resin 60 (four resin side surfaces 63 as described later). The semiconductor device A1 has a rectangular shape as viewed in the z direction (hereinafter, also referred to as "as viewed from the plane"). The size of the semiconductor device A1 is not particularly limited, but is 0.5 to 10 mm$^2$ as viewed from the plane.

The substrate 10 is made of a single-crystal intrinsic semiconductor material. In the present embodiment, the intrinsic semiconductor material is silicon (Si). As illustrated in FIGS. 2 and 3, the substrate 10 has a rectangular shape as viewed from the plane. The dimension (thickness) of the substrate 10 in the z direction is about 50 to 200 μm. The substrate 10 has a substrate main surface 11, a substrate rear surface 12, and a plurality of substrate side surfaces 13.

As illustrated in FIGS. 5 and 6, the substrate main surface 11 and the substrate rear surface 12 are separated in the z direction and face opposite sides to each other. The substrate main surface 11 is an upper surface of the substrate 10 illustrated in FIGS. 5 and 6, and substrate rear surface 12 is a lower surface of the substrate 10 illustrated in FIGS. 5 and 6. When the semiconductor device A1 is mounted on the circuit board, the substrate rear surface 12 faces the circuit board. In the present embodiment, the substrate rear surface 12 is exposed to the outside of the semiconductor device A1. Each of the plurality of substrate side surfaces 13 is sandwiched between the substrate main surface 11 and the substrate rear surface 12, as illustrated in FIGS. 5 and 6. In each substrate side surface 13, the upper end in the z direction illustrated in FIGS. 5 and 6 is connected to the substrate main surface 11 and the lower end in the z direction illustrated in FIGS. 5 and 6 is connected to the substrate rear surface 12. Each substrate side surface 13 is flat and orthogonal to each of the substrate main surface 11 and the substrate rear surface 12. In the present embodiment, as illustrated in FIGS. 2 and 3, the substrate 10 has four substrate side surfaces 13 respectively facing in different directions in the x direction and the y direction. Each substrate side surface 13 includes a region covered with each of the wiring layers 20 and a region covered with the sealing resin 60.

The wiring layer 20 is a conductor arranged inside the semiconductor device A1. The wiring layer 20 is electrically connected to the semiconductor element 40. In the present embodiment, the wiring layer 20 includes an underlayer and a plating layer stacked on each other. The underlayer includes a Ti layer and a Cu layer stacked on each other, and the thickness thereof is about 200 to 800 nm. The plating layer is formed outside the underlayer so as to be in contact with the underlayer. The main component of the plating layer is Cu, and the thickness thereof is set to be larger than that of the underlayer. Since the underlayer and the plating layer are integrated, they are indicated as the wiring layer 20 without distinction, as illustrated in FIG. 5. The material and film thickness of the wiring layer 20 are not limited. In the present embodiment, as illustrated in FIGS. 2 and 5, the wiring layer 20 includes a main surface electrode 21 and a side surface electrode 22. The main surface electrode 21 and the side surface electrode 22 are connected and integrally formed.

The main surface electrode 21 is a part of the wiring layer 20 formed so as to cover a portion of the substrate main surface 11 of the substrate 10. In the present embodiment, the thickness of the main surface electrode 21 is about 30 to 40 μm.

The side surface electrode 22 is a part of the wiring layer 20 formed so as to cover a portion of the substrate side surface 13 of the substrate 10. In the present embodiment, the thickness of the side surface electrode 22 is about 10 to 30 μm. As illustrated in FIG. 5, the side surface electrode 22 has a side exposed surface 221 and a rear exposed surface 222. The side exposed surface 221 faces in the same direction as the substrate side surface 13. The side exposed surface 221 is flush with a side surface of the sealing resin 60 (a resin side surface 63 as described later). The rear exposed surface 222 faces in the same direction as the substrate rear surface 12. The rear exposed surface 222 is flush with the substrate rear surface 12.

Each of the external platings 30 is a conductor which is electrically connected to the wiring layer 20 and is exposed to the outside. The external plating 30 serves as a terminal when the semiconductor device A1 is mounted on the circuit board. The external plating 30 is formed by electroless plating. In the present embodiment, the external plating 30 includes an Ni layer, a Pd layer, and an Au layer stacked on each other. The thickness of the external plating 30 is about 3 to 15 μm. The thickness, material, and forming method of the external plating 30 are not limited. For example, the external plating 30 may be formed by stacking an Ni layer and an Au layer, or may be formed by an Au layer only.

As illustrated in FIGS. 3 and 6, the external plating 30 includes a side surface coating part 31 and a rear surface coating part 32. The side surface coating part 31 and the rear surface coating part 32 are connected to each other. The side surface coating part 31 is a part of the external plating 30 formed on the side surface of the semiconductor device A1, and covers the side exposed surface 221 of the side surface electrode 22. The rear surface coating part 32 is a part of the external plating 30 formed on the rear surface of the semiconductor device A1, and covers the rear exposed surface 222 and a portion of the substrate rear surface 12. The rear surface coating part 32 is formed to extend from the rear exposed surface 222 to a portion of the substrate rear surface 12.

The semiconductor element 40 is an element serving as a functional center of the semiconductor device A1. The semiconductor element 40 is, for example, an integrated circuit (IC) such as large scale integration (LSI). The semiconductor element 40 may also be a voltage control element such as low drop out (LDO), an amplification element such as an operational amplifier, or a discrete semiconductor element such as a diode. The semiconductor element 40 has a rectangular shape as viewed from the plane. The semiconductor element 40 is mounted on the substrate 10. The semiconductor element 40 is mounted by flip chip bonding. The semiconductor element 40 overlaps the substrate 10 as viewed from the plane. As illustrated in FIGS. 5 and 6, the semiconductor element 40 has an element main surface 41 and an element rear surface 42.

The element main surface 41 and the element rear surface 42 are separated in the z direction and face opposite sides to each other. The element main surface 41 faces in the same direction as the substrate main surface 11 of the substrate 10. The element rear surface 42 faces in the same direction as the substrate rear surface 12 of the substrate 10. The element rear surface 42 faces the substrate main surface 11. A plurality of electrode pads (not shown) are formed on the element rear surface 42. The electrode pads are each made of, for example, aluminum (Al).

The conductive binder 50 is a conductive member interposed between the main surface electrode 21 of the wiring layer 20 and the electrode pad of the semiconductor element 40, as illustrated in FIG. 5. In the present embodiment, the electrode pad of the semiconductor element 40 and the main surface electrode 21 are connected via the conductive binder 50. The material of the conductive binder 50 is not particularly limited, but in the present embodiment, it includes an alloy containing tin (Sn). Examples of such an alloy include lead-free solder such as an Sn—Sb based alloy or an Sn—Ag based alloy, solder containing lead (Pb), and the like. The conductive binder 50 may be a solder paste, an Ag paste, or the like. In the present embodiment, the semiconductor element 40 is fixed to the main surface electrode 21 (wiring layer 20) by the conductive binder 50.

The sealing resin 60 is a synthetic resin using, for example, a black epoxy resin as a main agent. The sealing resin 60 covers the semiconductor element 40 and a portion of the wiring layer 20, as illustrated in FIGS. 5 and 6. The sealing resin 60 has a rectangular shape as viewed from the plane. The sealing resin 60 is larger than the substrate 10 as viewed from the plane. The sealing resin 60 has a resin main surface 61, a resin rear surface 62, and a plurality of resin side surfaces 63.

The resin main surface 61 and the resin rear surface 62 are separated in the z direction and face opposite sides to each other, as illustrated in FIGS. 4 and 6. As illustrated in FIG. 6, the resin main surface 61 faces in the same direction as the element main surface 41 and the resin rear surface 62 faces in the same direction as the element rear surface 42. Each of the plurality of resin side surfaces 63 faces in the same direction as each substrate side surface 13, as illustrated in FIG. 6. Furthermore, as illustrated in FIG. 5, the wiring layer 20 (side surface electrode 22) is exposed from each resin side surface 63. Each resin side surface 63 is flush with the side exposed surface 221 of the side surface electrode 22.

Next, an example of a method of manufacturing the semiconductor device A1 will be described with reference to FIGS. 7 to 22. FIG. 7 is a perspective view illustrating one process of the method of manufacturing the semiconductor device A1. FIGS. 8, 10, 12, 17, 19, and 21 are plan views illustrating one process of the method of manufacturing the semiconductor device A1. FIGS. 9, 11, 13 to 15, 18, 20, and 22 are cross-sectional views illustrating one process of the method of manufacturing the semiconductor device A1. These cross-sectional views correspond to the cross section illustrated in FIG. 5. FIG. 16 is a bottom view illustrating one process of the method of manufacturing the semiconductor device A1.

First, as illustrated in FIG. 7, a base material 800 having a main surface 801 and a rear surface 802 facing opposite sides to each other in the z direction is provided. The base material 800 is an aggregate of parts corresponding to the substrate 10 of the semiconductor device A1. In the present embodiment, the material of the base material 800 is an intrinsic semiconductor material of Si. In a process of providing the base material 800 (base material providing process), as illustrated in FIG. 7, for example, a silicon wafer is provided as the base material 800. Although an orientation flat is formed in the silicon wafer (base material 800) illustrated in FIG. 7, a notch may be formed instead of the orientation flat, or neither an orientation flat nor a notch may be formed.

Figure 8:
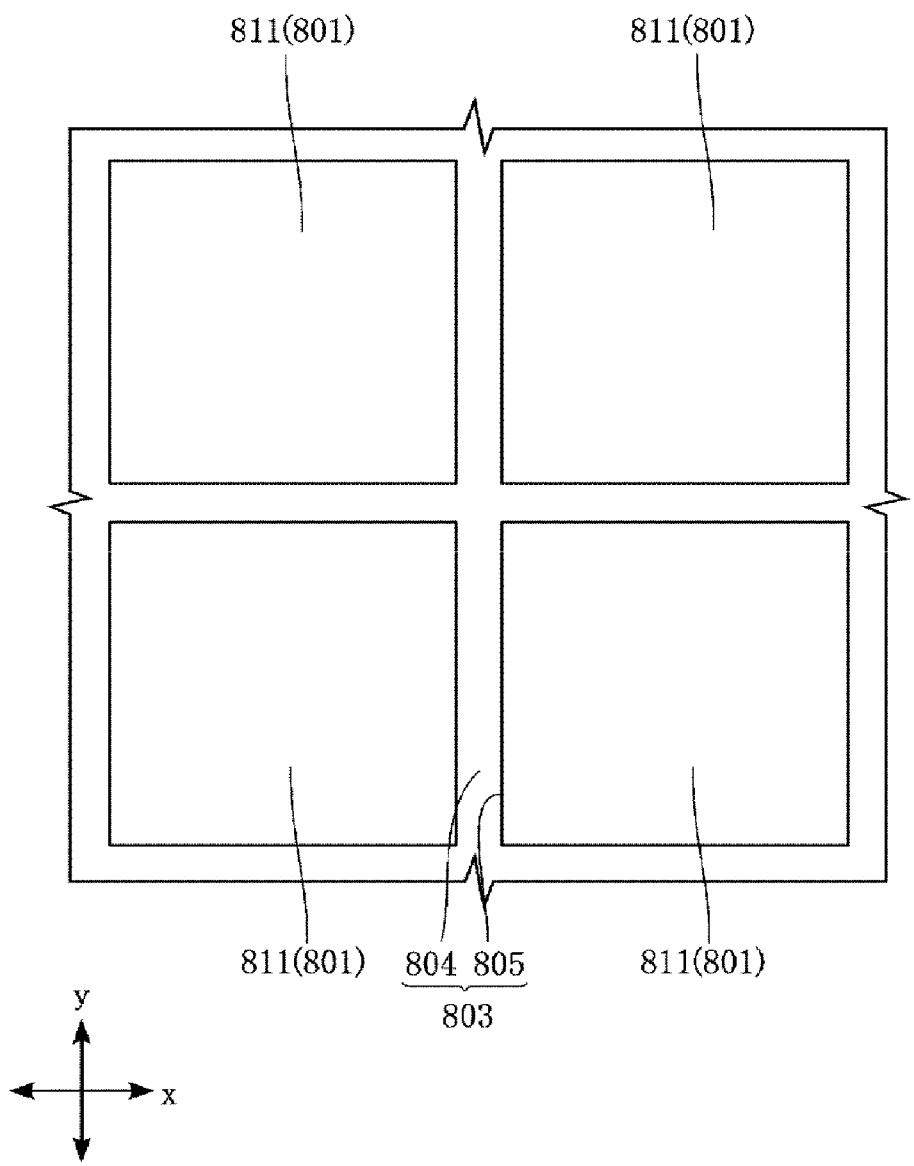
FIG. 8 is a plan view illustrating one process of the method of manufacturing a semiconductor device according to the first embodiment.
Figure 9:
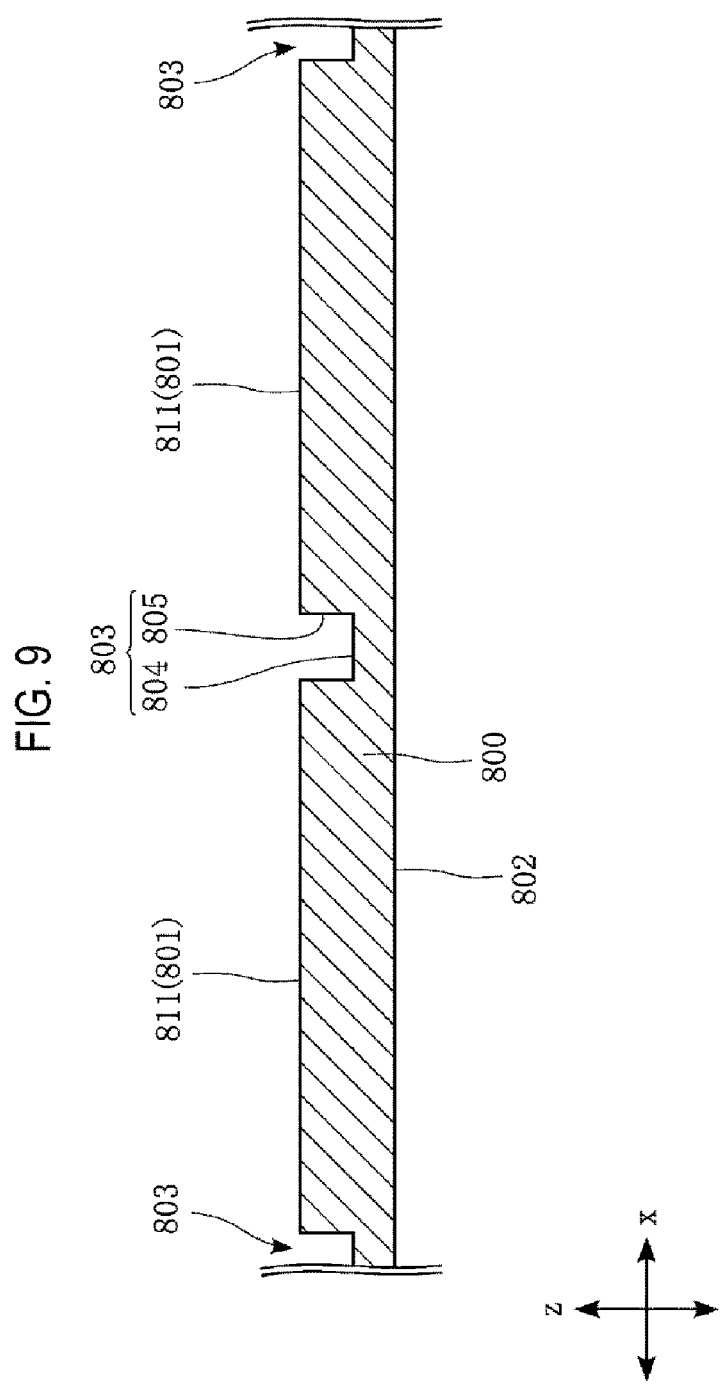
FIG. 9 is a cross-sectional view illustrating one process of the method of manufacturing a semiconductor device according to the first embodiment.

Next, as illustrated in FIG. 8 and FIG. 9, a groove portion 803 recessed in the z direction from the main surface 801 is formed in the base material 800. In a process of forming the groove portion 803 (groove portion forming process), for example, half-cut dicing by blade dicing is performed. In the present embodiment, half-cut dicing is performed along dicing lines DL illustrated in FIG. 7 to form a groove (groove portion 803) having a depth of about 50 to 200 μm from the main surface 801 without cutting the base material 800. The thickness of the dicing blade used in the half-cut dicing (blade dicing) is about 80 to 120 μm. Therefore, the groove portion 803 has a width of about 80 to 120 μm. In the present embodiment, as illustrated in FIG. 8, the groove portion 803 is formed in a lattice shape in which a plurality of bars extending in the x direction and a plurality of bars extending in the y direction intersect each other. The groove portion 803 has a bottom surface 804 and a standing surface 805. In the standing surface 805, the upper end in the z direction illustrated in FIG. 9 is connected to the substrate main surface 811 and the lower end in the z direction illustrated in FIG. 9 is connected to the bottom surface 804. The standing surface 805 stands from the bottom surface 804, and is orthogonal to the bottom surface 804 in the present embodiment. Further, the main surface 801 is divided into a plurality of substrate main surfaces 811 in the groove portion forming process. The substrate main surfaces 811 correspond to the substrate main surface 11 of the substrate 10 of the semiconductor device A1.

Figure 10:
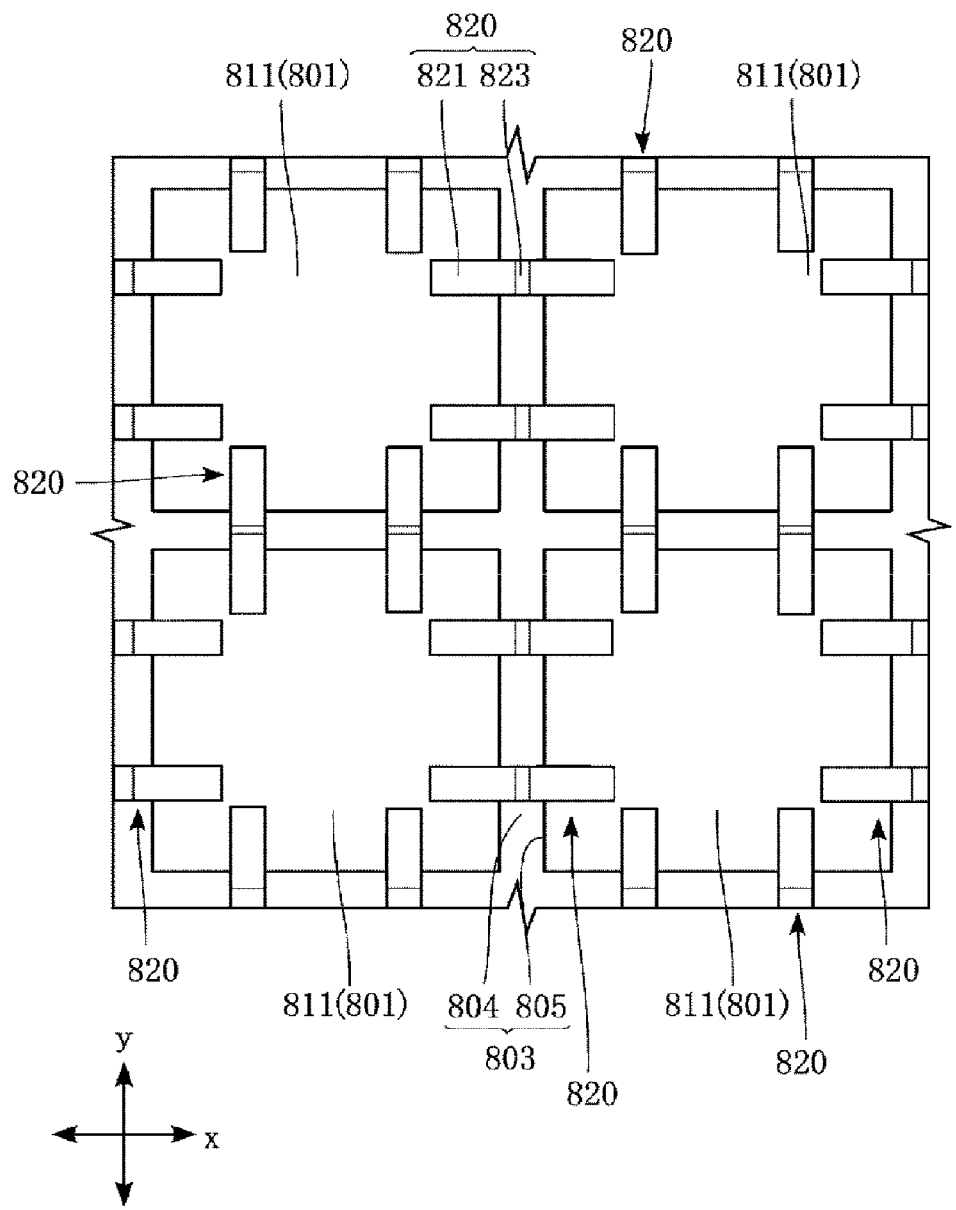
FIG. 10 is a plan view illustrating one process of the method of manufacturing a semiconductor device according to the first embodiment.
Figure 11:
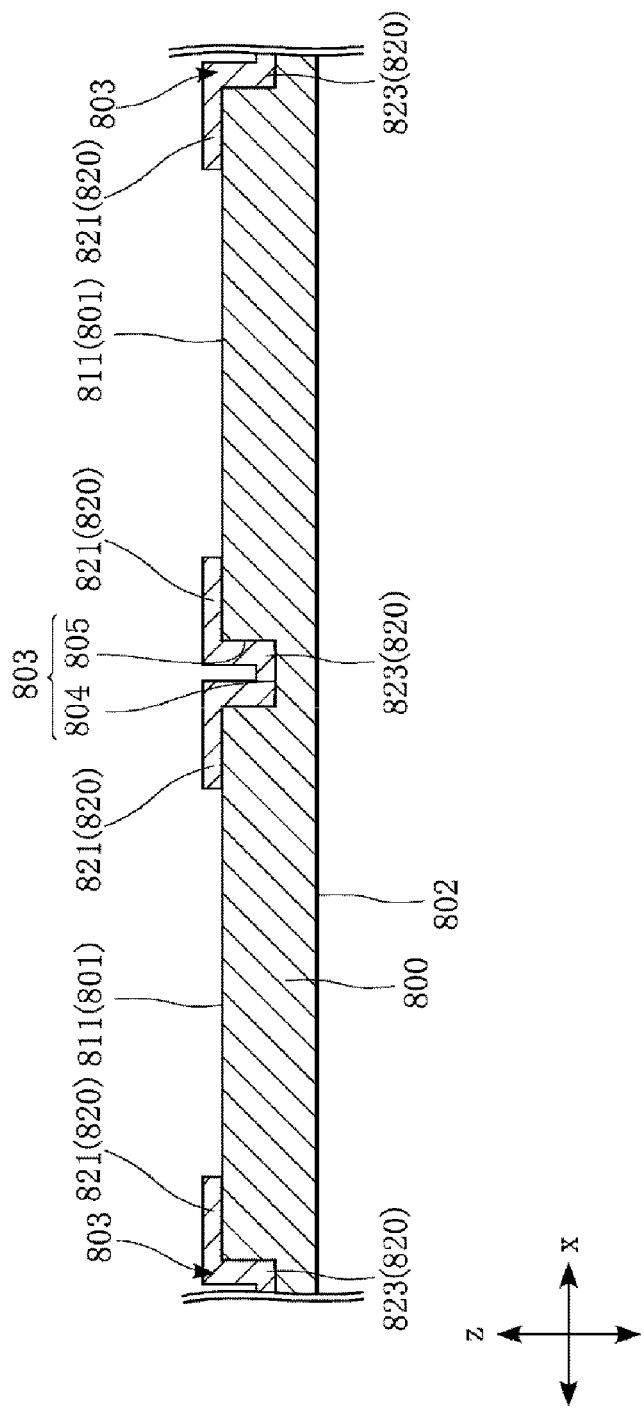
FIG. 11 is a cross-sectional view illustrating one process of the method of manufacturing a semiconductor device according to the first embodiment.

Next, as illustrated in FIGS. 10 and 11, a wiring layer 820 is formed on the base material 800. The wiring layer 820 corresponds to the wiring layer 20 of the semiconductor device A1 as described below. In a process of forming the wiring layer 820 (wiring layer forming process), as illustrated in FIGS. 10 and 11, a conductive film is formed to cover a portion of each substrate main surface 811 and a portion of the groove portion 803. In the present embodiment, the wiring layer 820 includes an underlayer and a plating layer stacked on each other. A specific processing of the wiring layer forming process is not particularly limited, but it is performed, for example, as follows. For example, sputtering or CVD is used to form the underlayer. Then, a photosensitive resist is applied so as to cover the entire surface of the underlayer, and patterning is performed by exposing and developing the photosensitive resist. By this patterning, a portion of the underlayer (a portion forming the plating layer) is exposed to form a plating layer on the exposed underlayer by electrolytic plating using the underlayer as a conductive path. The main component of the plating layer is Cu. Thereafter, the wiring layer 820 illustrated in FIGS. 10 and 11 is formed by removing the resist layer and removing the underlayer exposed from the plating layer. The wiring layer 820 formed by the wiring layer forming process includes a main surface electrode 821 formed to cover a portion of the substrate main surface 811, and an in-groove conductor 823 formed to cover a portion of the groove portion 803.

Figure 12:
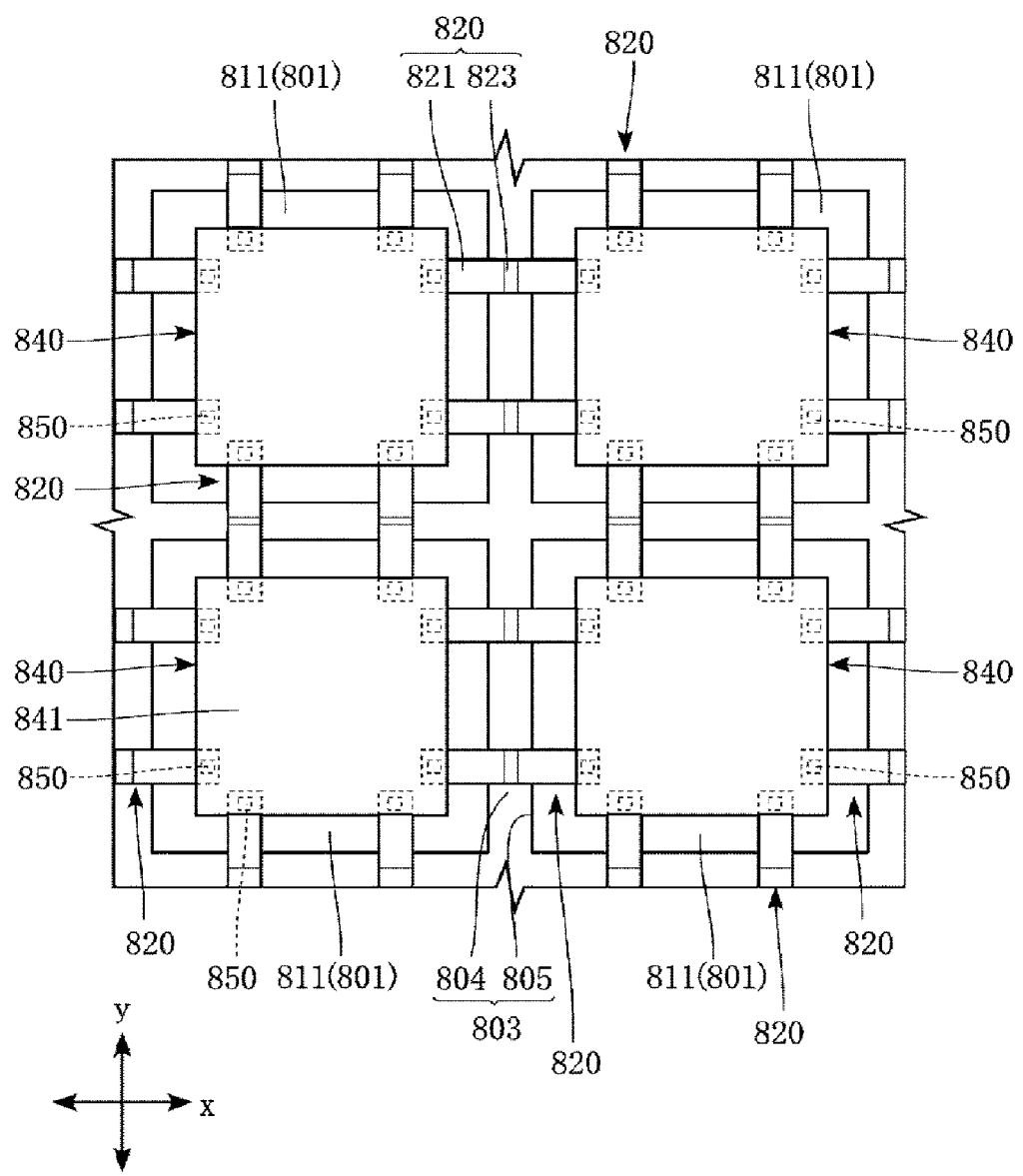
FIG. 12 is a plan view illustrating one process of the method of manufacturing a semiconductor device according to the first embodiment.
Figure 13:
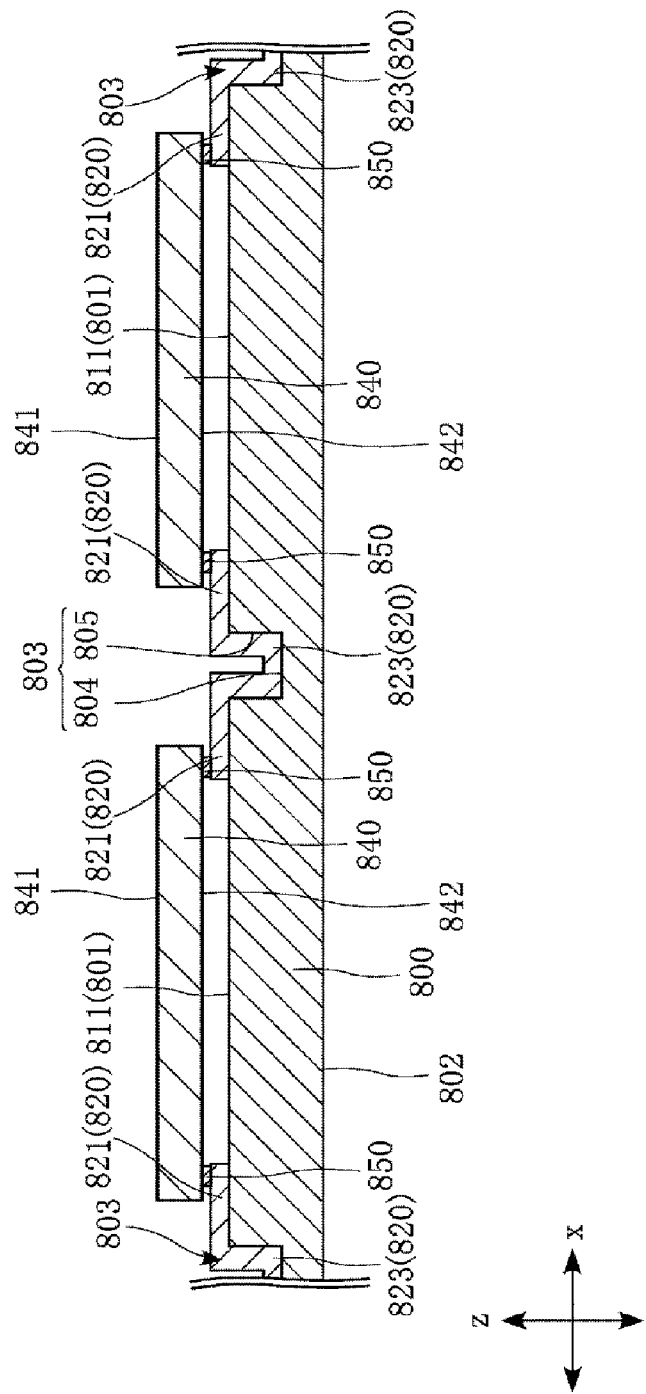
FIG. 13 is a cross-sectional view illustrating one process of the method of manufacturing the semiconductor device according to the first embodiment.

Next, as illustrated in FIG. 12 and FIG. 13, a semiconductor element 840 is mounted on the base material 800. The semiconductor element 840 corresponds to the semiconductor element 40 of the semiconductor device A1. A process of mounting the semiconductor element 840 (element mounting process) is performed by flip chip bonding. Specifically, a conductive binder 850 is formed on a portion of the main surface electrode 821 of the wiring layer 820, and thereafter, flux is applied to electrode bumps (not shown) of the semiconductor element 840. The forming method and material of the conductive binder 850 are not particularly limited. In the present embodiment, for example, lead-free solder such as an Sn—Ag based alloy or an Sn—Sb based alloy is formed as the conductive binder 850 by electrolytic plating. In this case, a conductive underlayer is formed to cover the wiring layer 820 and the entire surface of each substrate main surface 811 by sputtering or CVD, and thereafter, a resist is pattern-formed on the underlayer. Then, the conductive binder 850 is formed on the underlayer exposed from the resist by electrolytic plating using the underlayer as a conductive path, and thereafter, the resist and the underlayer not covered with the conductive binder 850 are removed. Thus, the conductive binder 850 illustrated in FIGS. 12 and 13 is formed. Alternatively, for example, a solder paste or an Ag paste may be formed as the conductive binder 850 by screen printing. Then, the semiconductor element 840 is temporarily bonded to the conductive binder 850, with the element rear surface 842 facing the base material 800 (substrate main surface 811) using flip chip bonder. In a state where the semiconductor element 840 is temporarily bonded by the conductive binder 850, the conductive binder 850 is sandwiched between the wiring layer 820 (main surface electrode 821) and the semiconductor element 840. Next, the conductive binder 850 is melted by reflow and then solidified by cooling, and the mounting of the semiconductor element 840 is completed.

Figure 14:
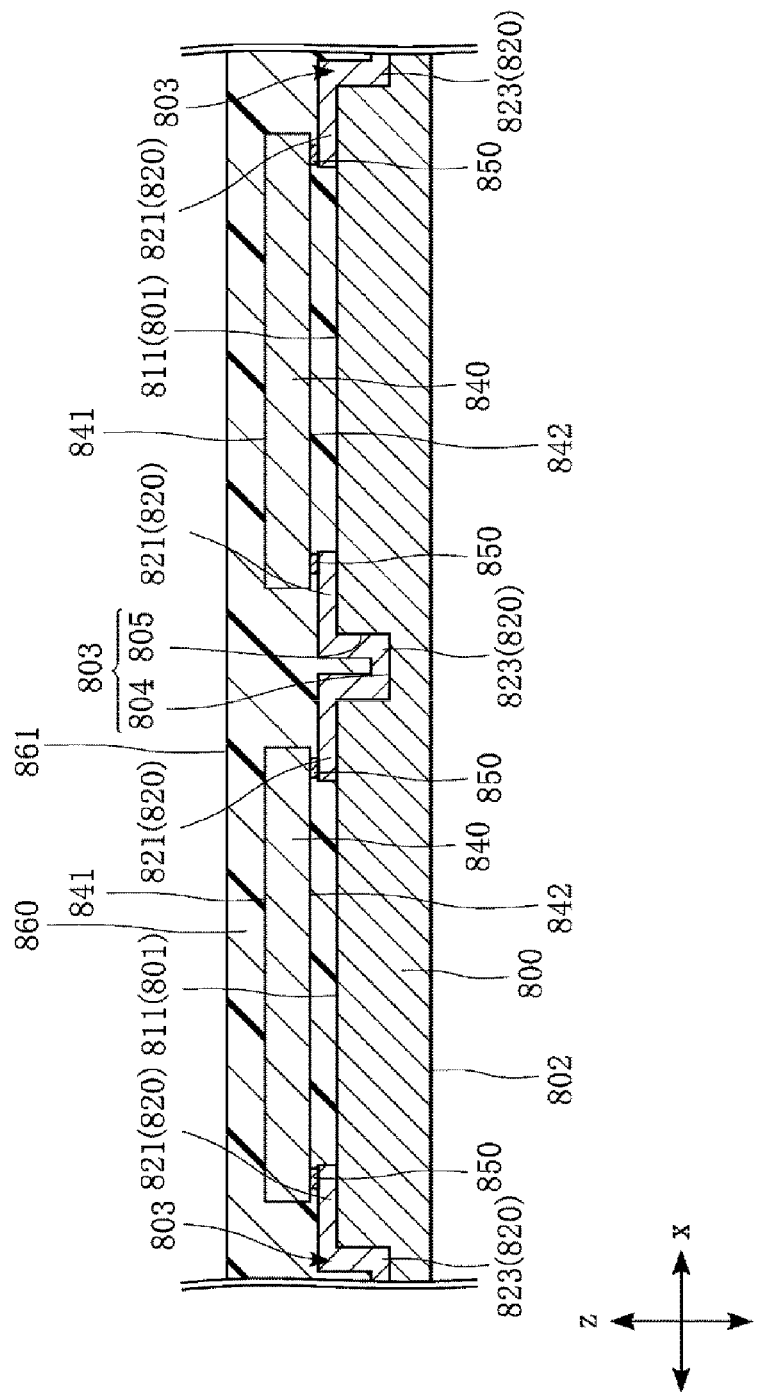
FIG. 14 is a cross-sectional view illustrating one process of the method of manufacturing a semiconductor device according to the first embodiment.

Next, as illustrated in FIG. 14, a sealing resin 860 is formed to cover the semiconductor element 840 and a portion of the wiring layer 820 (main surface electrode 821). The sealing resin 860 corresponds to the sealing resin 60 of the semiconductor device A1 later. The sealing resin 860 according to the present embodiment has an electrical insulating property, and is, for example, a synthetic resin using a black epoxy resin as a main agent. In a process of forming the sealing resin 860 (sealing resin forming process), the sealing resin 860 is formed over the entire main surface 801 side of the base material 800 so as to completely cover the semiconductor element 840 without exposing it. At this time, the sealing resin 860 has a resin main surface 861 that faces in the same direction as the main surface 801 of the base material 800, and also has a portion filled in the groove portion 803.

Figure 15:
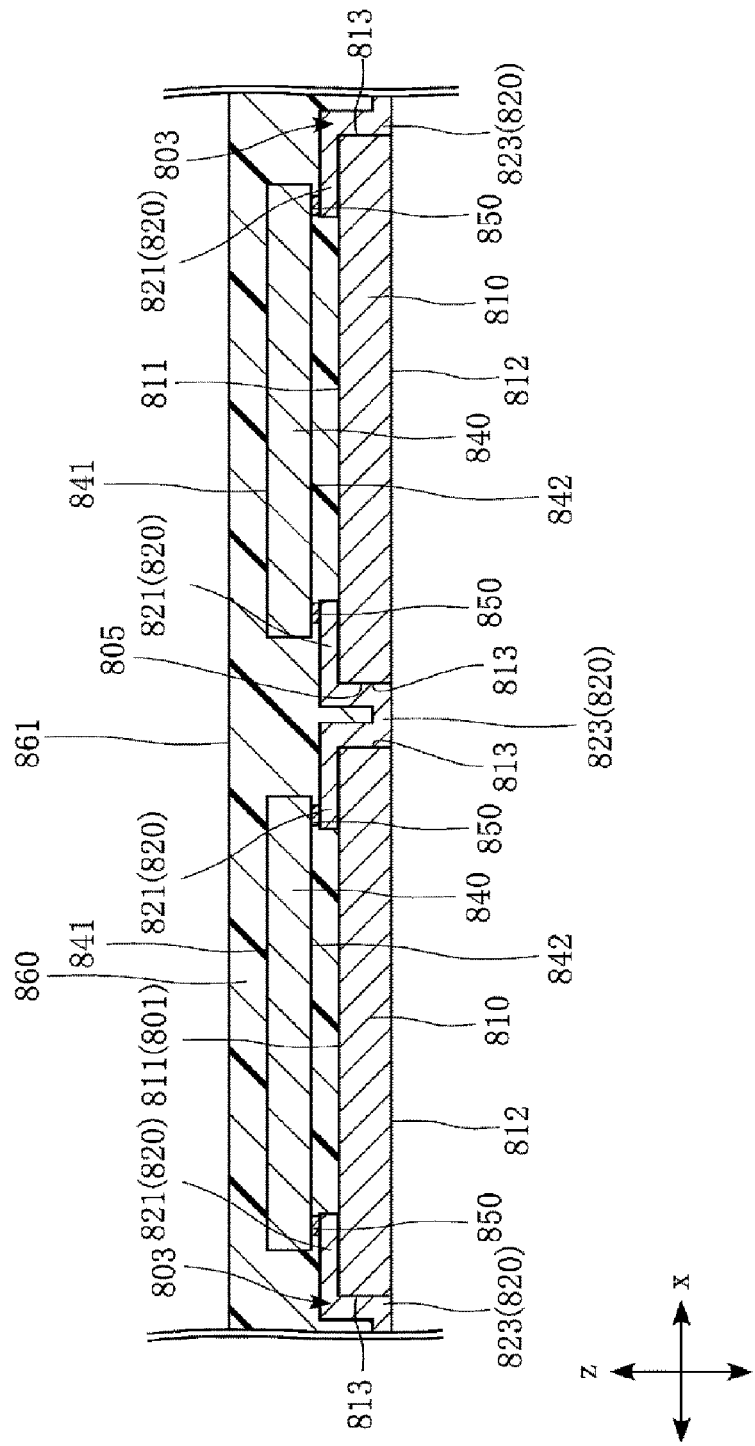
FIG. 15 is a cross-sectional view illustrating one process of the method of manufacturing a semiconductor device according to the first embodiment.
Figure 16:
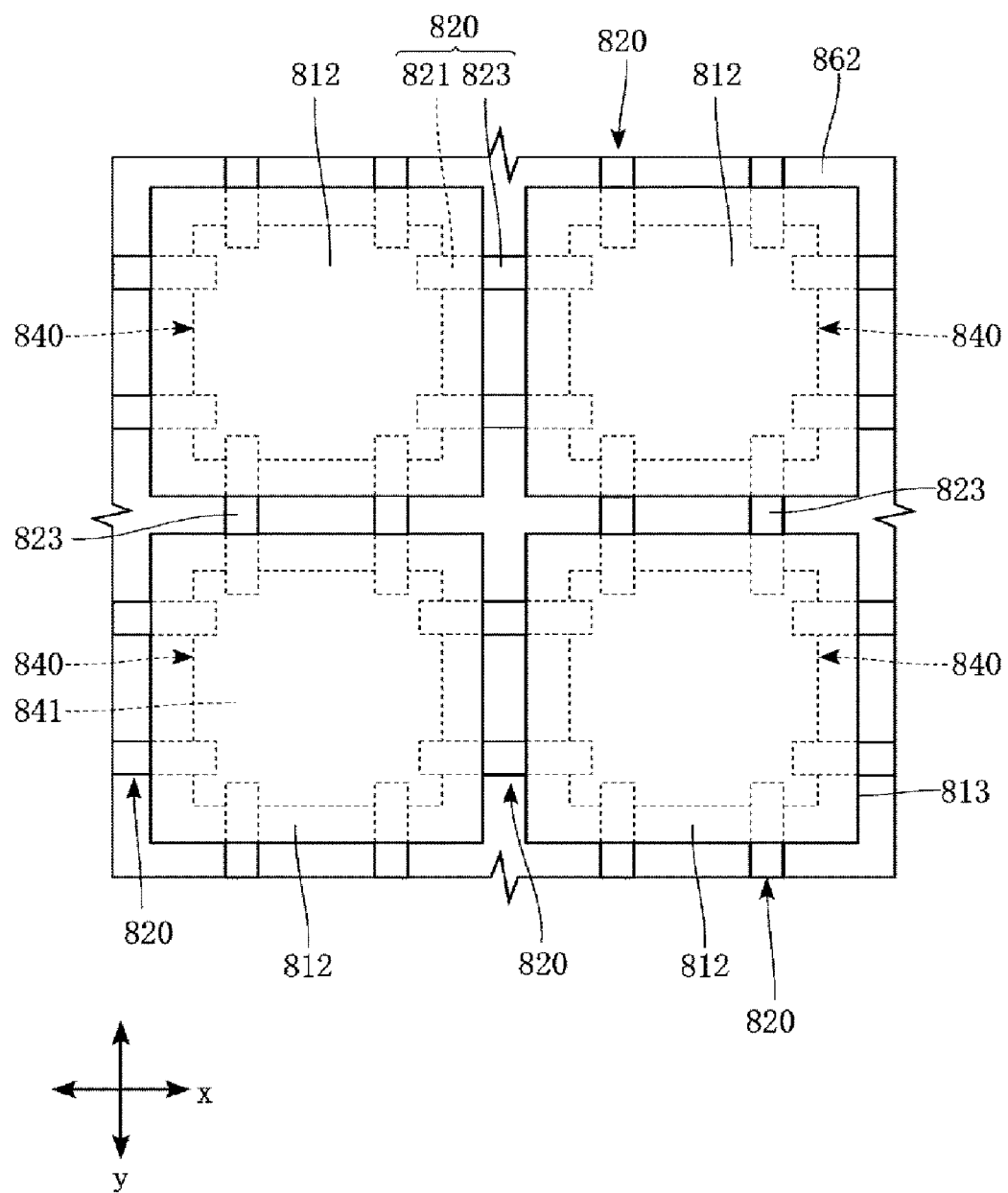
FIG. 16 is a bottom view illustrating one process of the method of manufacturing a semiconductor device according to the first embodiment.
Figure 17:
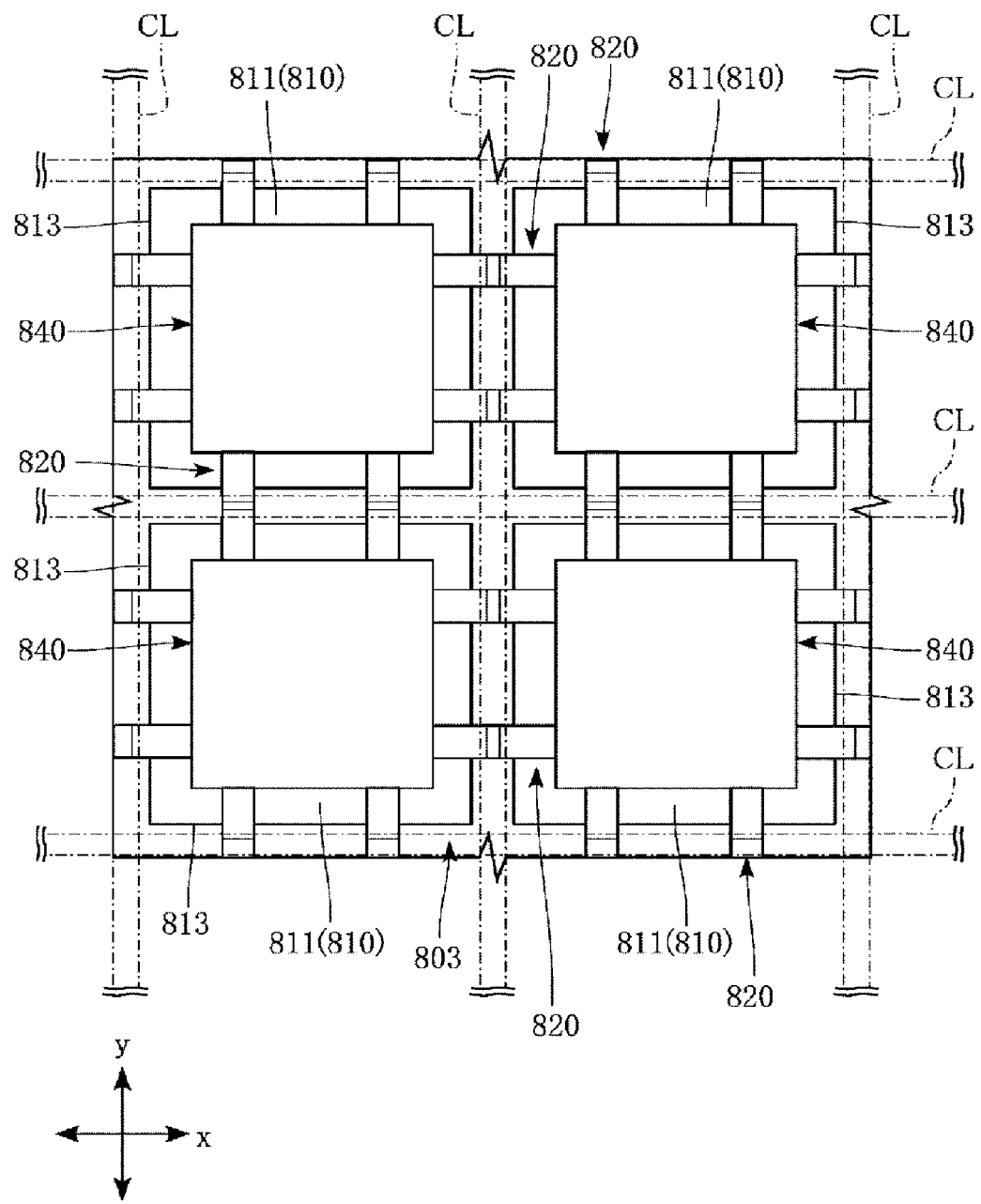
FIG. 17 is a plan view illustrating one process of the method of manufacturing a semiconductor device according to the first embodiment.
Figure 18:
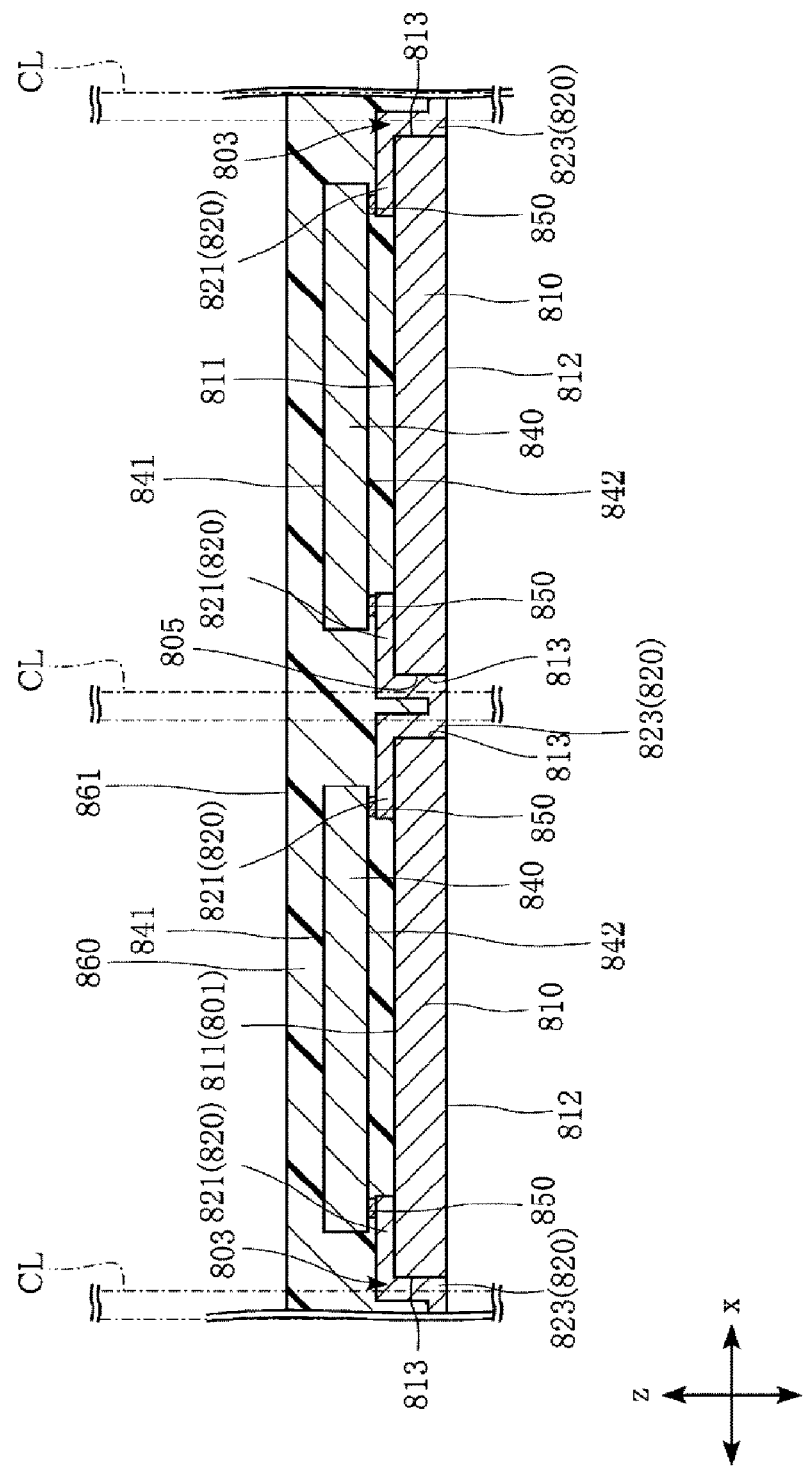
FIG. 18 is a cross-sectional view illustrating one process of the method of manufacturing a semiconductor device according to the first embodiment.

Next, as illustrated in FIGS. 15 and 16, the base material 800 is ground from the rear surface 802 side. In a process of grinding the base material 800 (grinding process), grinding is performed until the in-groove conductor 823 is exposed from the base material 800. The base material 800 located below the groove portion 803 in the z direction is scraped off by the grinding process, and the in-groove conductor 823 formed in the groove portion 803 and the sealing resin 860 are exposed from the rear surface 802. Furthermore, in the grinding process, the base material 800 is divided for each semiconductor element 840 to form a plurality of substrates 810. Each of the plurality of substrates 810 has the substrate main surface 811, the substrate rear surface 812, and the plurality of substrate side surfaces 813. Each substrate side surface 813 has a portion covered with the sealing resin 860 and a portion covered with the wiring layer 820 (in-groove conductor 823). In addition, a resin rear surface 862 is formed on the sealing resin 860 by the grinding process. The resin rear surface 862 is flush with the substrate rear surface 812.

Figure 19:
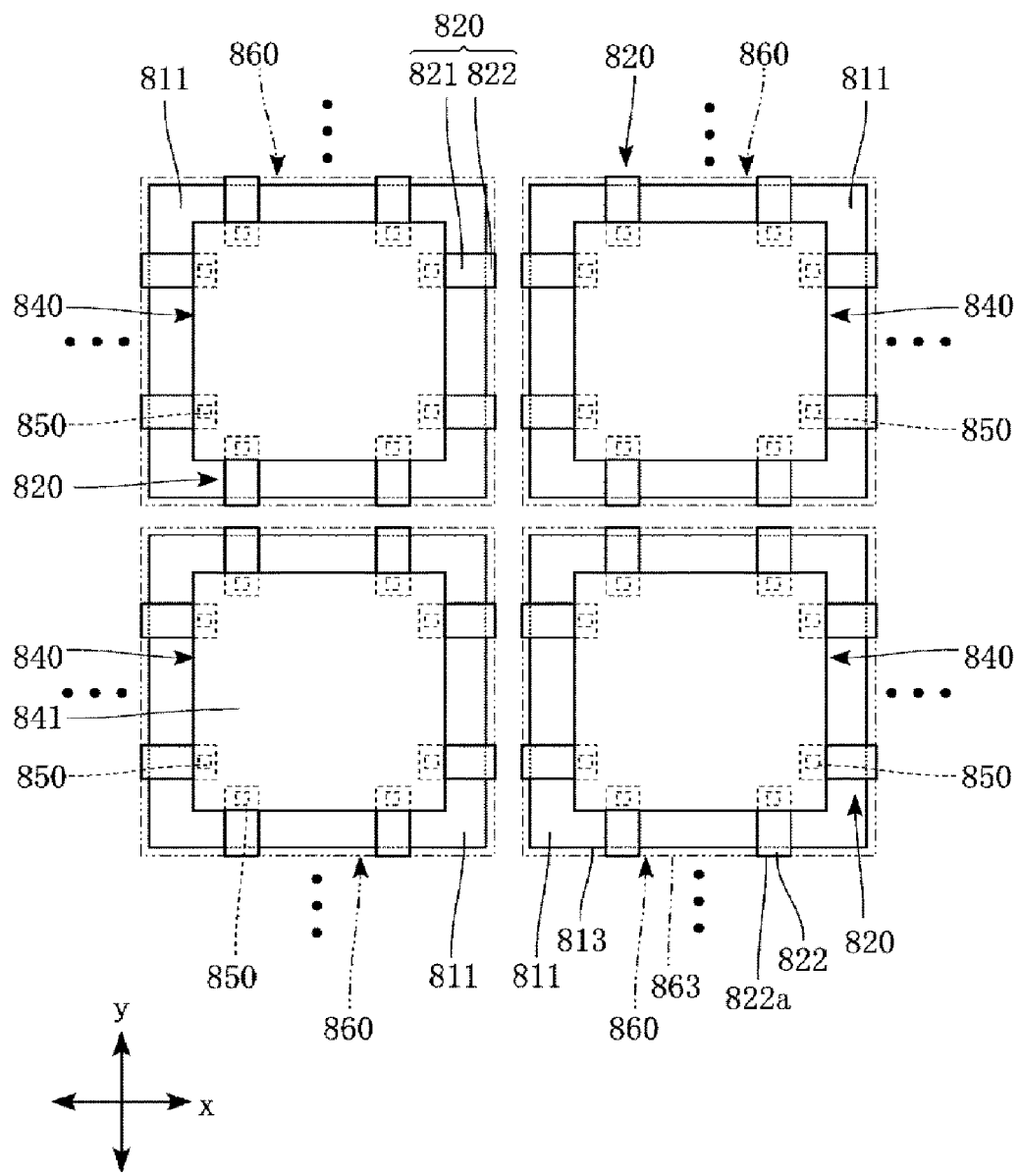
FIG. 19 is a plan view illustrating one process of the method of manufacturing a semiconductor device according to the first embodiment.
Figure 20:
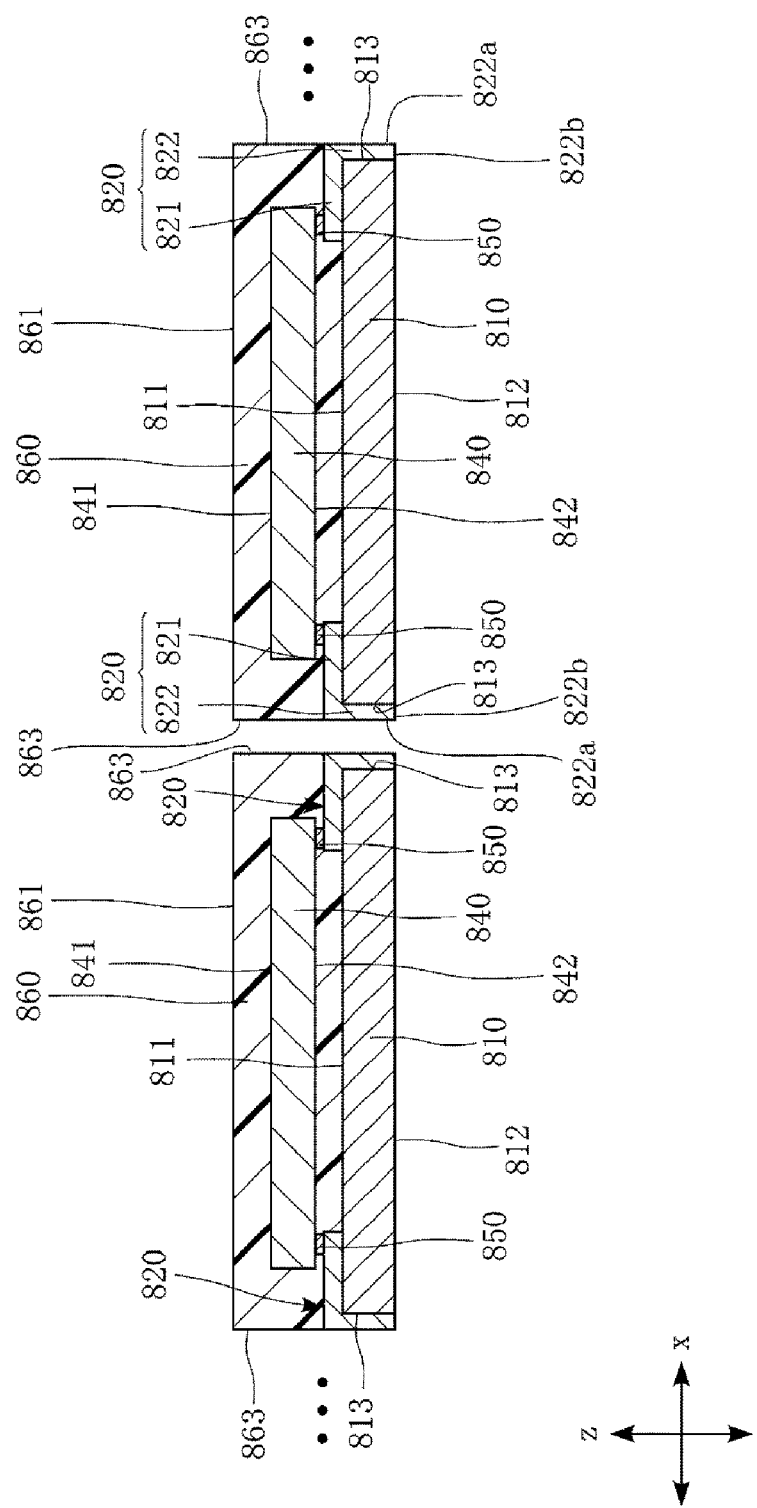
FIG. 20 is a cross-sectional view illustrating one process of the method of manufacturing a semiconductor device according to the first embodiment.

Next, as illustrated in FIGS. 17 to 20, the sealing resin 860 and a portion of the wiring layer 820 (in-groove conductor 823) are cut. A process of cutting (cutting process) is performed by blade dicing. In the present embodiment, full-cut dicing is performed along cutting lines CL illustrated in FIGS. 17 and 18 to divide each of the semiconductor elements 840 into individual pieces. The cutting lines CL are along the groove portion 803. The full-cut dicing uses a dicing blade having a thickness smaller than the dicing blade used in the groove portion forming process. For example, a dicing blade having a thickness of about 60 to 80 μm is used. By the cutting process, as illustrated in FIGS. 19 and 20, the in-groove conductor 823 is divided to form a side surface electrode 822 covering the substrate side surface 813. The side surface electrode 822 has a side exposed surface 822a exposed from the resin side surface 863 of the sealing resin 860 and a rear exposed surface 822b exposed from the resin rear surface 862 of the sealing resin 860. Furthermore, as illustrated in FIGS. 19 and 20, the side exposed surface 822a and the resin side surface 863 are flush with each other. The rear exposed surface 822b, the resin rear surface 862, and the substrate rear surface 812 are flush with one another. A dicing tape is provided to stick to the resin main surface 861 side between the sealing resin forming process and the cutting process, and a cutting process (dicing) is performed so as not to cut the dicing tape so that the individual pieces of each of the semiconductor elements 840 are not scattered after the cutting process.

Figure 21:
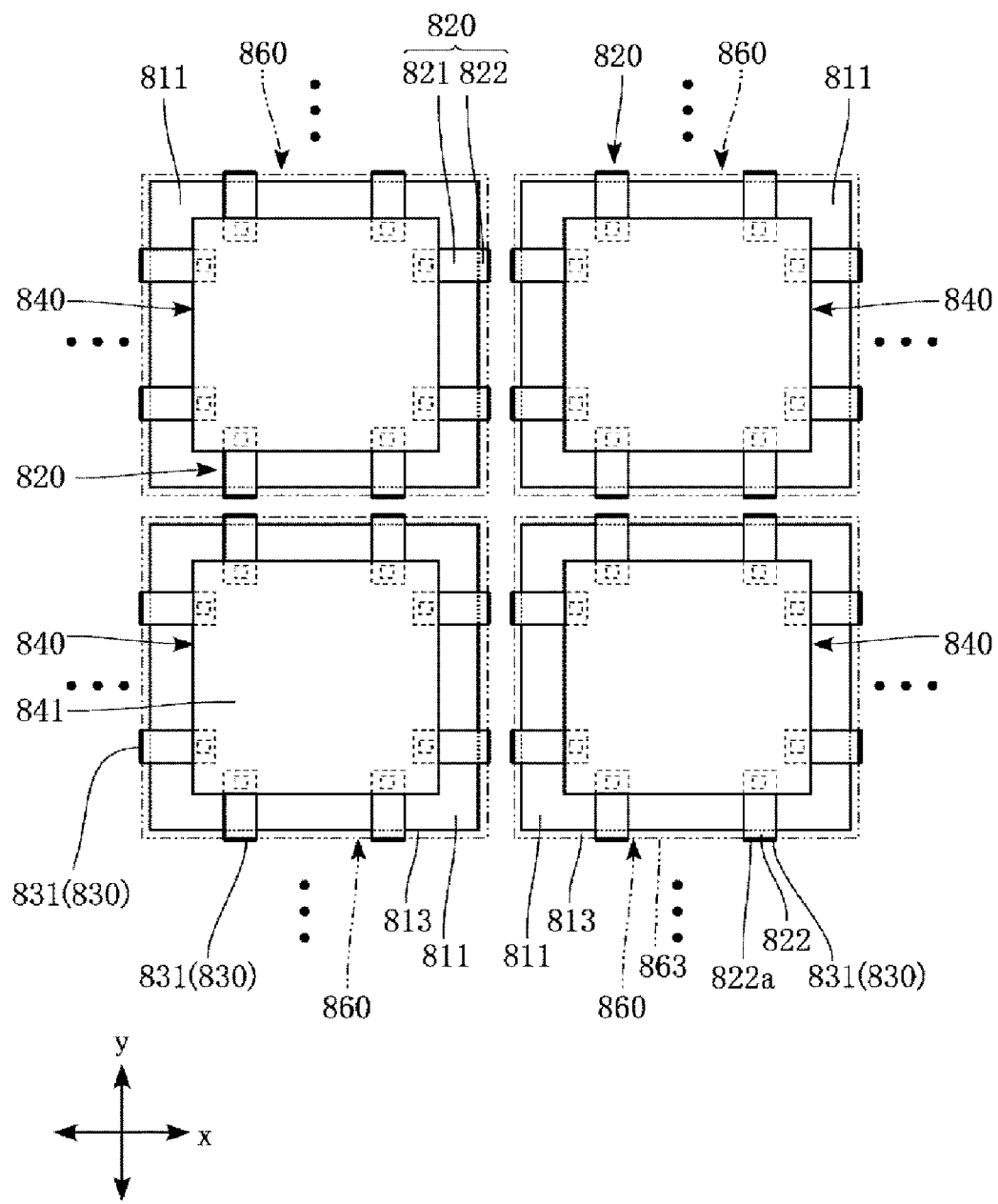
FIG. 21 is a plan view illustrating one process of the method of manufacturing a semiconductor device according to the first embodiment.
Figure 22:
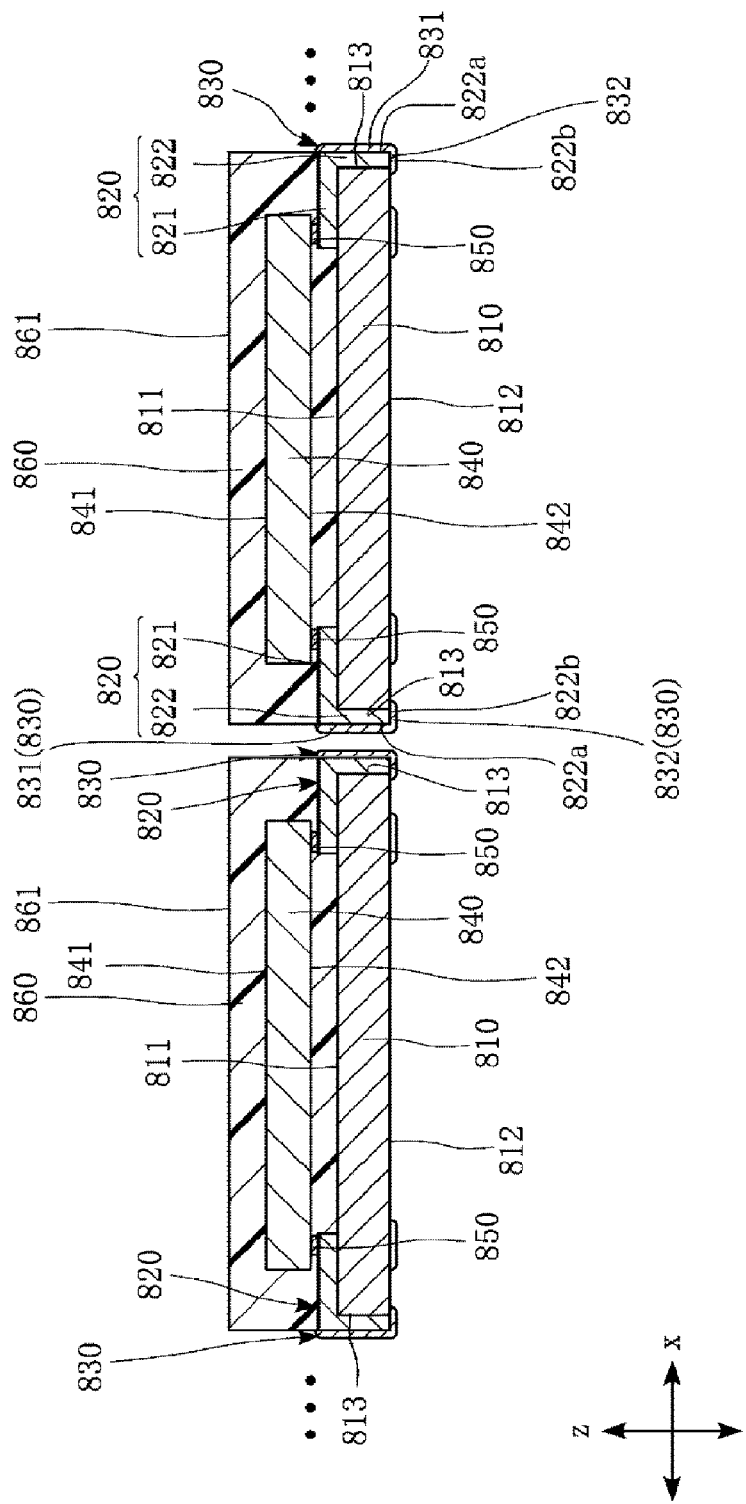
FIG. 22 is a cross-sectional view illustrating one process of the method of manufacturing a semiconductor device according to the first embodiment.

Next, as illustrated in FIGS. 21 and 22, an external plating 830 is formed. The external plating 830 corresponds to the external plating 30 of the semiconductor device A1. A process of forming the external plating 830 (external plating forming process) is performed by electroless plating. In the present embodiment, an Ni layer, a Pd layer, and an Au layer are deposited in this order by electroless plating. At this time, the Ni layer is formed to be in contact with and to cover the wiring layer 820 exposed from the sealing resin 860. Then, the Pd layer is formed on the Ni layer, and the Au layer is formed on the Pd layer. Thus, the external plating 830 illustrated in FIGS. 21 and 22 is formed. Furthermore, since the Ni layer is not deposited on the base material 800 (substrate 810) made of silicon, the external plating 830 is not formed on the substrate rear surface 812. The external plating 830 formed in the external plating forming process is formed to cover the side surface electrodes 822 of the wiring layer 820. The external plating 830 includes a side surface coating part 831 configured to cover the side exposed surface 822a and a rear surface coating part 832 configured to cover the rear exposed surface 822b.

Through the aforementioned processes, the semiconductor device A1 illustrated in FIGS. 1 to 6 is manufactured. The method of manufacturing the semiconductor device A1 described above is an example, and is not limited thereto.

Next, operational effects of the semiconductor device A1 and the method of manufacturing the semiconductor device A1 will be described.

According to the semiconductor device A1, the wiring layer 20 includes the side surface electrode 22 that covers the substrate side surface 13 of the substrate 10. Furthermore, the side exposed surface 221 of the side surface electrode 22 is flush with the resin side surface 63, and is exposed from the resin side surface 63 of the sealing resin 60. In this configuration, when the semiconductor device A1 is mounted on the circuit board using solder, the solder is formed on the side surface of the semiconductor device A1. Thus, it is possible to easily and visually confirm the bonding state of the solder from above and from the side.

According to the semiconductor device A1, the external plating 30 that covers the side surface electrode 22 of the wiring layer 20 is included. The external plating 30 is made of a material having higher solder wettability than that of the wiring layer 20. Therefore, when the semiconductor device A1 is mounted on the circuit board, the solder is uniformly spread on the surface of external plating 30. Thus, since the bonding strength of the solder can be enhanced, it is possible to enhance the mounting strength of semiconductor device A1 on the circuit board. Furthermore, the material of the wiring layer 20 is Cu, and an oxide film is formed on the surface of Cu by oxidation in the atmosphere. The oxide film has a lower wettability and conductivity of the solder than Cu. Thus, it is possible to prevent degradation in wettability of the solder and degradation in conductivity of the solder by covering the wiring layer 20 (side surface electrode 22) with the external plating 30.

According to the method of manufacturing the semiconductor device A1, the sealing resin 860 and a portion of the wiring layer 820 are cut in the blade dicing of the cutting process. Thus, the base material 800 (substrate 810) is not cut in the blade dicing. Since the base material 800 is made of silicon, which is an intrinsic semiconductor material, and is a relatively hard material, chipping may occur when the base material 800 is blade diced. However, in the present embodiment, since the base material 800 is not cut, it is possible to prevent occurrence of chipping.

Figure 23:
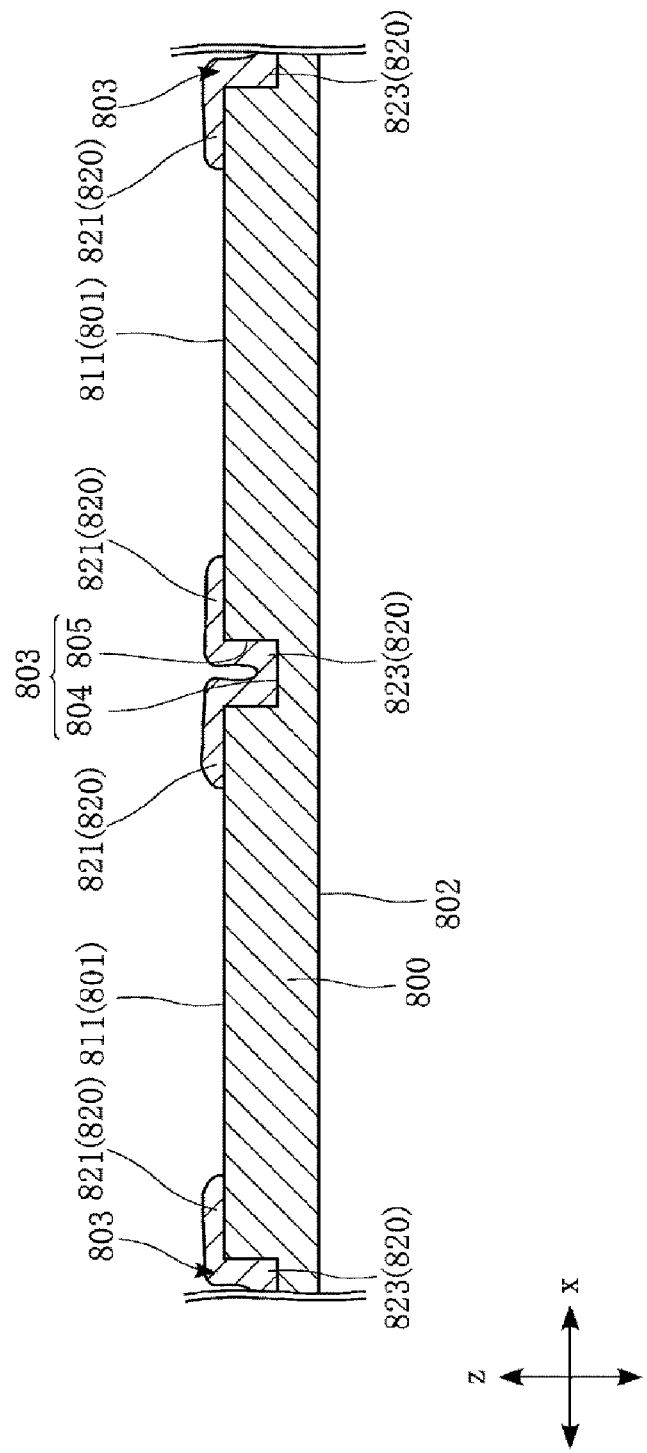
FIG. 23 is a cross-sectional view illustrating one process of a method of manufacturing a semiconductor device according to an exemplary modification of the first embodiment.
Figure 24:
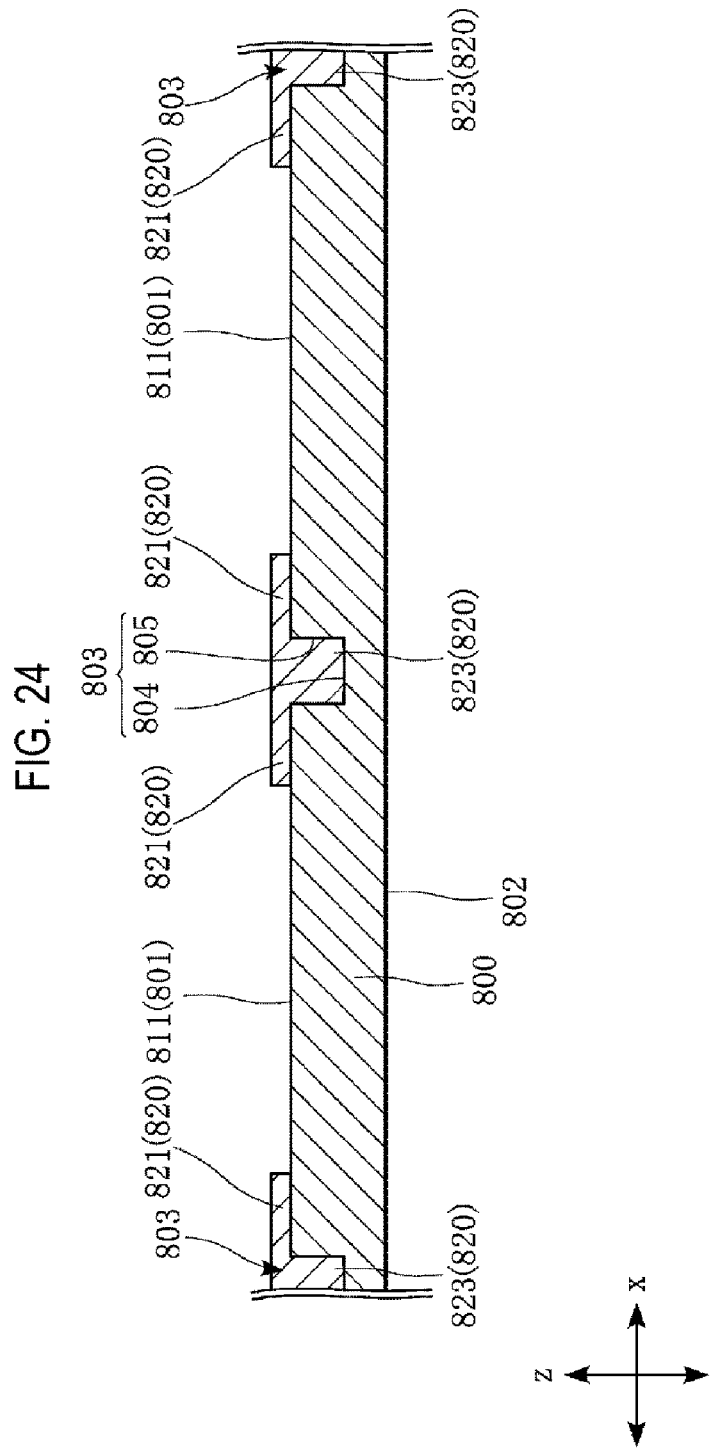
FIG. 24 is a cross-sectional view illustrating one process of the method of manufacturing a semiconductor device according to an exemplary modification of the first embodiment.

In the aforementioned manufacturing method, there has been described a case where the wiring layer 820 formed by the wiring layer forming process has a cross-sectional shape illustrated in FIG. 11. However, the present disclosure is not limited thereto. For example, as illustrated in FIG. 23, the thickness of the in-groove conductor 823 (wiring layer 820) may vary depending on a difference in the processing methods of the wiring layer forming process, a difference in the amounts of deposition of the underlayer and the plating layer, or the like. In addition, as illustrated in FIG. 24, the groove portion 803 may be filled with the in-groove conductor 823. Even in these cases, the in-groove conductor 823 is cut by a subsequent cutting process to form the side surface electrode 822 having the side exposed surface 822a as illustrated in FIG. 20. In addition, the wiring layer 820 formed by the wiring formation process not only varies in thickness, but also may vary in dimension in the width direction. As described above, when the dimension of the wiring layer 820 in the width direction varies, for example, as illustrated in FIG. 25, an edge 221a extending in the z direction has a curved shape in the side surface electrode 22 of the wiring layer 20. Furthermore, since the external plating 30 is formed to cover the side surface electrode 22, as illustrated in FIG. 25, the external plating 30 has a shape corresponding to the side exposed surface 221 of the side surface electrode 22. In FIG. 25, there has been described a case where the side surface electrode 22 is curved so that a width dimension d1 of the central portion in the z direction is large and a width dimension d2 of the outer portion in the z direction is small, but in contrast thereto, the edge 221a may be curved so that the width direction dimension of the central portion in the z direction is small and the width direction dimension of the outer portion in the z direction is large. Alternatively, the edge 221a may be curved like a wave.

FIGS. 26 to 30 illustrate other embodiments of the semiconductor device and the manufacturing method thereof according to the present disclosure. In these drawings, the same or similar elements as or to those of the aforementioned embodiment are denoted by the same reference numerals as those of the aforementioned embodiment.

Figure 26:
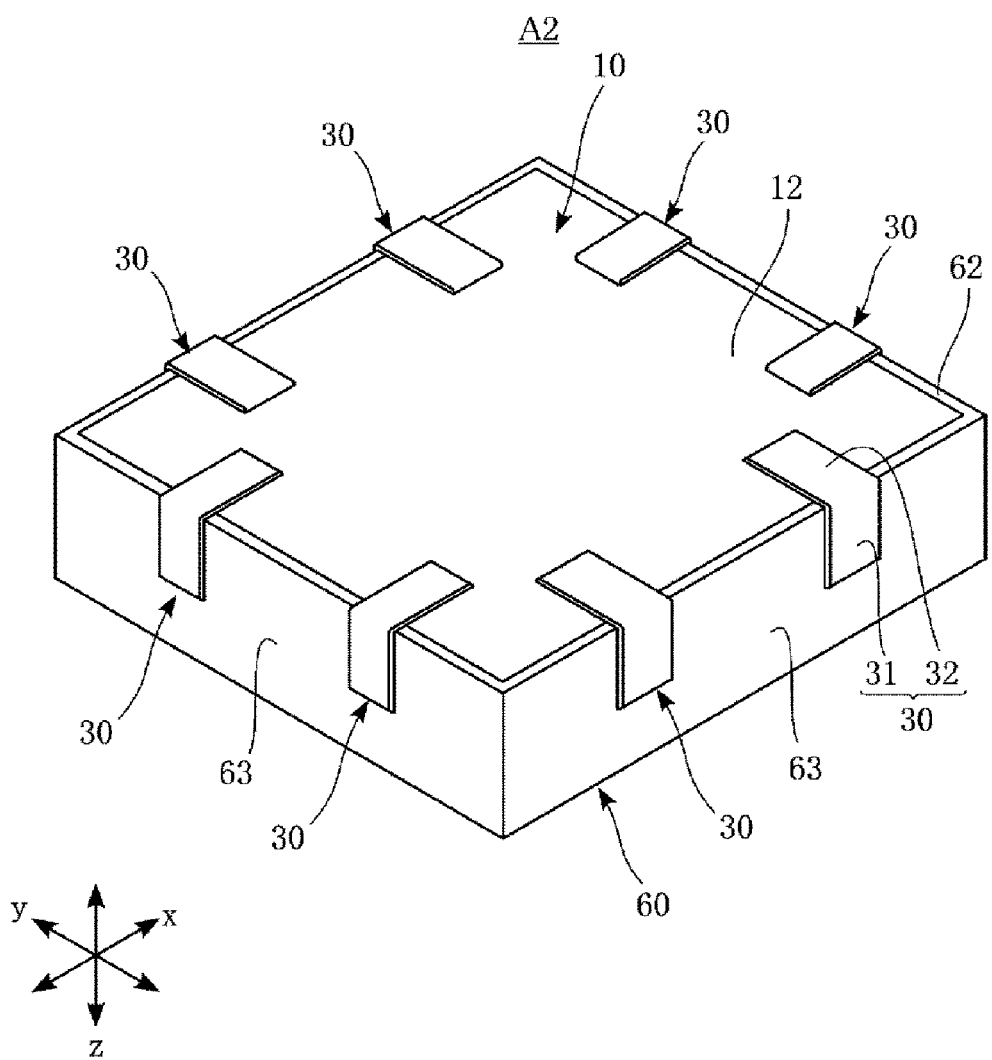
FIG. 26 is a perspective view (a perspective view seen from the bottom side) illustrating a semiconductor device according to a second embodiment of the present disclosure.
Figure 27:
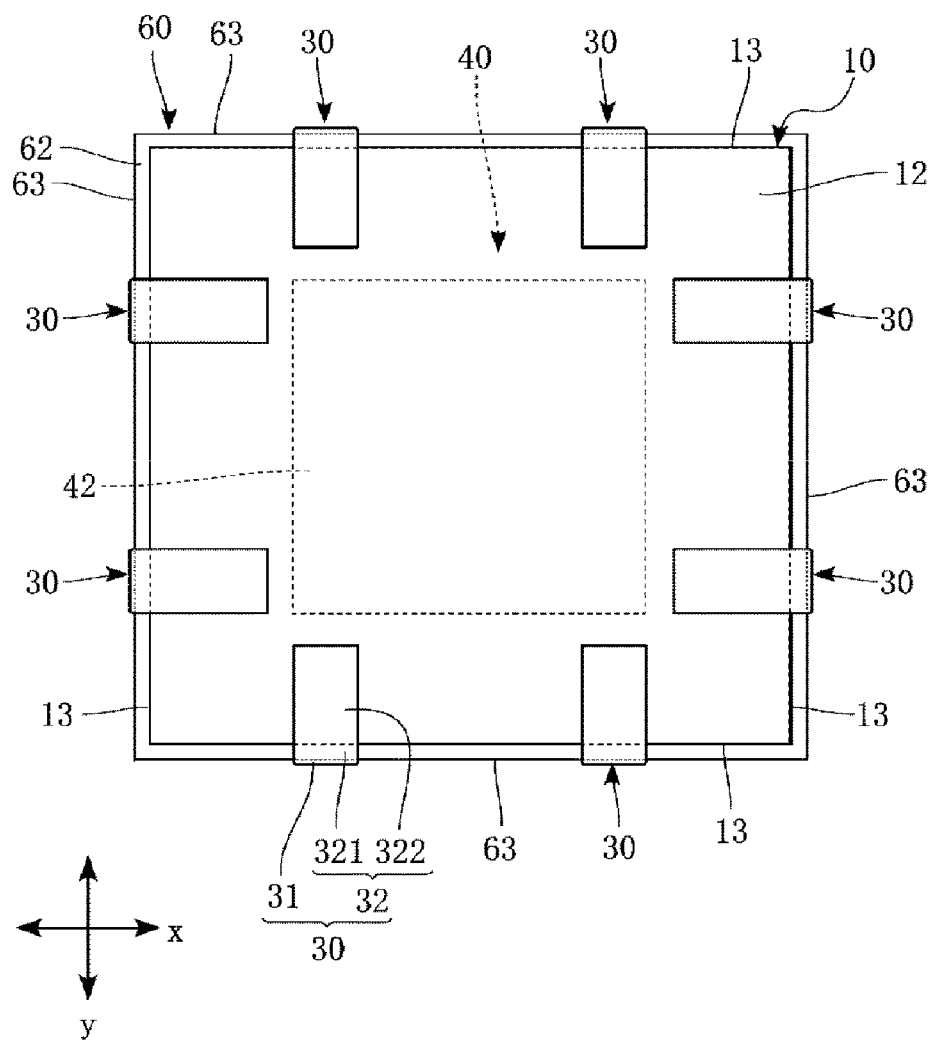
FIG. 27 is a bottom view illustrating the semiconductor device according to the second embodiment.
Figure 28:
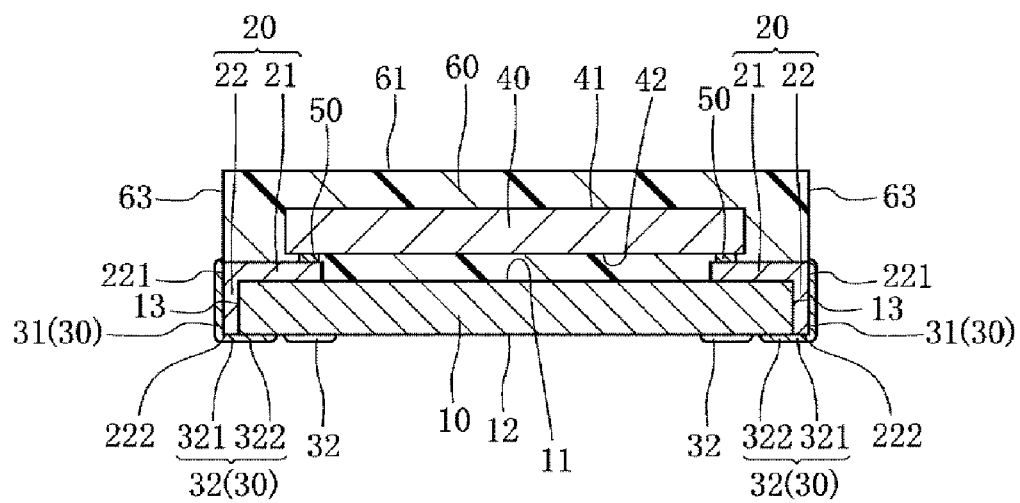
FIG. 28 is a cross-sectional view illustrating the semiconductor device according to the second embodiment.

FIGS. 26 to 28 illustrate a semiconductor device according to a second embodiment of the present disclosure. A semiconductor device A2 of the second embodiment is mainly different from the semiconductor device A1, in that the rear surface coating part 32 of the external plating 30 is formed to extend from the rear exposed surface 222 to a portion of the substrate rear surface 12.

FIG. 26 is a perspective view illustrating the semiconductor device A2, and illustrates a state as viewed from the bottom side of the semiconductor device A2. FIG. 27 is a bottom view illustrating the semiconductor device A2. FIG. 28 is a cross-sectional view illustrating the semiconductor device A2, which is a cross-section corresponding to FIG. 5 of the first embodiment.

In the present embodiment, as described above, in the external plating 30, the rear surface coating part 32 is formed to extend from the rear exposed surface 222 to a portion of the substrate rear surface 12. As illustrated in FIGS. 27 and 28, the rear surface coating part 32 includes a rear exposed surface coating part 321 and a substrate rear surface coating part 322. The rear exposed surface coating part 321 covers the rear exposed surface 222 of the side surface electrode 22 of the wiring layer 20. The substrate rear surface coating part 322 covers a portion of the substrate rear surface 12 of the substrate 10.

In the present embodiment, the rear surface coating part 32 of the external plating 30 has a rectangular shape as viewed from the plane. The dimension of the rear surface coating part 32 in the longitudinal direction is about 50 to 200 μm as viewed from the plane. In addition, the rear surface coating part 32 includes a seed layer and a metal layer stacked on each other. The seed layer is in contact with a portion of the substrate rear surface 12 and the rear exposed surface 222, and is formed by stacking, for example, a Ti layer and a Cu layer. In this case, the Ti layer is in contact with a portion of the substrate rear surface 12 and the rear exposed surface 222, and the Cu layer is formed on the Ti layer. The metal layer is in contact with the seed layer, and is formed by stacking, for example, an Ni layer, a Pd layer, and an Au layer. The material of the metal layer is not limited thereto, but it may be formed by stacking an Ni layer and an Au layer or may be formed by an Au layer only.

The forming method of the external plating 30 of the present embodiment is not specifically limited, but for example, it is performed as follows. The forming method forms the seed layer in a part that forms the external plating 30 after the grinding process and before the cutting process. A forming region of the seed layer is, for example, the entire surface of the in-groove conductor 823 exposed from substrate rear surface 812 and a portion of the substrate rear surface 812 connected thereto. The formation of the seed layer is performed by forming, for example, a Ti layer and a Cu layer on the entire surface on the substrate rear surface 812 side of the substrate 810 by sputtering, CVD, or the like in the state illustrated in FIG. 15. Then, a patterned photosensitive resist is formed by photolithography. Then, the Ti and Cu layers exposed from the photosensitive resist are removed by etching, and thereafter, the photosensitive resist is removed. Thus, the seed layer is formed on the entire surface of the in-groove conductor 823 exposed from the substrate rear surface 812 and on a portion of the substrate rear surface 812 connected thereto. After the formation of the seed layer, the external plating 30 illustrated in FIGS. 26 to 28 is formed by performing the cutting process and the external plating forming process described above.

According to the semiconductor device A2, the wiring layer 20 (side surface electrode 22) exposed from the sealing resin 60 in the same manner as the semiconductor device A1 is included. Therefore, when the semiconductor device A2 is mounted on the circuit board using solder, the solder is formed on the side surface of the semiconductor device A2. Thus, it is possible to easily and visually confirm the bonding state of the solder from above and from the side.

According to the semiconductor device A2, the rear surface coating part 32 of the external plating 30 is larger than the rear surface coating part 32 of the first embodiment. Therefore, when the semiconductor device A2 is mounted on the circuit board using solder, the area which bonds the solder can be enlarged. Thus, since the bonding strength of the solder can be enhanced, it is possible to enhance the mounting strength of the semiconductor device A2 on the circuit board. Furthermore, in the semiconductor device A2, a solder fillet is easily formed so as to span the side surface coating part 31 and the rear surface coating part 32.

Figure 29:
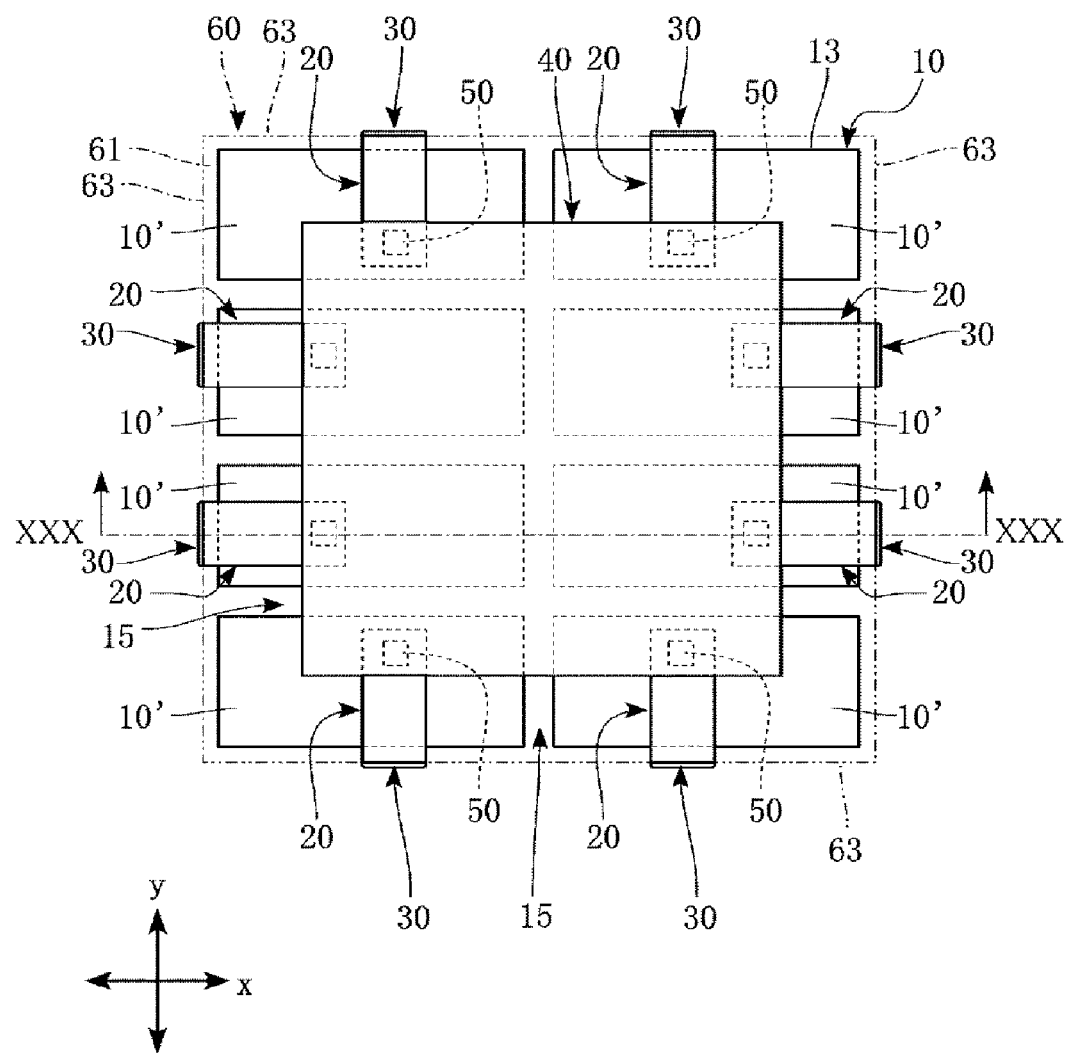
FIG. 29 is a plan view illustrating a semiconductor device according to a third embodiment of the present disclosure.

FIGS. 29 and 30 illustrate a semiconductor device according to a third embodiment of the present disclosure. A semiconductor device A3 of the third embodiment is mainly different from the semiconductor device A1, in that grooves 15 penetrating from the substrate main surface 11 to the substrate rear surface 12 are formed in the substrate 10.

FIG. 29 is a plan view illustrating the semiconductor device A3. In FIG. 29, the sealing resin 60 is indicated by an imaginary line (two-dot chain line). FIG. 30 is a cross-sectional view taken along line XXX-XXX in FIG. 29, and corresponds to the cross section illustrated in FIG. 5 of the first embodiment.

In the present embodiment, as illustrated in FIGS. 29 and 30, a plurality of grooves 15 are formed in the substrate main surface 11 of the substrate 10. In the present embodiment, one groove 15 extending along the y direction and three grooves 15 extending along the x direction are formed. Each of the plurality of grooves 15 penetrates from the substrate main surface 11 to the substrate rear surface 12, and is filled with the sealing resin 60. The substrate 10 is divided into a plurality of substrates 10' by the plurality of grooves 15. Wiring layers 20 are respectively formed on the respective substrates 10'. Each wiring layer 20 is electrically connected to the semiconductor element 40 via the conductive binder 50. The plurality of substrates 10' are insulated from each other by the sealing resin 60 filled in the grooves 15. The arrangement and shape of the grooves 15 are not limited.

The forming method of the grooves 15 in the present embodiment is not particularly limited, but for example, it is performed as follows. The forming method forms grooves corresponding to the grooves 15 when the groove portion 803 is formed in the groove portion forming process illustrated in FIGS. 8 and 9. In the formation of the grooves, half-cut dicing is performed by blade dicing in the same manner as the groove portion 803. The depth of the grooves in the half-cut dicing is equal to the depth of the groove portion 803. Furthermore, the thickness of the dicing blade used for half-cut dicing for forming the grooves 15 may be equal to or different from the thickness of the dicing blade used when forming the groove portion 803. The subsequent processes are the same as those of the first embodiment.

According to the semiconductor device A3, similar to the semiconductor device A1, the wiring layer 20 (side surface electrode 22) exposed from the sealing resin 60 is included. Therefore, when the semiconductor device A3 is mounted on the circuit board using solder, the solder is formed on the side surface of the semiconductor device A3. Thus, it is possible to easily and visually confirm the bonding state of the solder from above and from the side.

According to the semiconductor device A3, the substrate 10 is divided into regions (the plurality of substrates 10') insulated from each other by the grooves 15. Therefore, current paths do not occur between the respective regions via the substrate 10. Thus, it is possible to prevent an unintended short-circuit between the terminals of the semiconductor element 40 and to enhance robustness against a leakage current.

In the first to third embodiments, there has been described a case where the wiring layer 20 is in contact with the substrate 10. However, the present disclosure is not limited thereto, and an insulating layer may be interposed between the wiring layer 20 and the substrate 10. As such an insulating layer, $SiO_2$, polyimide resin, phenol resin, or the like may be used. For example, in the case of $SiO_2$, the base material 800 can be formed by thermally oxidizing the base material 800 after the groove portion forming process and before the wiring layer forming process. Therefore, the insulating layer made of $SiO_2$ covers at least the substrate main surface 11 and the substrate side surface 13 of the substrate 10.

In the first to third embodiments, there has been described a case where the external plating 30 as a terminal is formed on each resin side surface 63 by exposing the wiring layer 20 (side surface electrode 22) from each of the four resin side surfaces 63. However, the present disclosure is not limited thereto. For example, the wiring layer 20 (side surface electrode 22) may be exposed in each of a pair of resin side surfaces 63 facing in the x direction or in each of a pair of resin side surfaces 63 facing in the y direction. That is, the semiconductor devices A1 to A3 are illustrated as being a so-called QFN package type, but may be a so-called SON package type.

In the first to third embodiments, there has been described a case where the two side surface electrodes 22 are exposed from one resin side surface 63, but the number of side surface electrodes 22 exposed from one resin side surface 63 is not limited thereto. That is, the number of side surface electrodes 22 exposed from one resin side surface 63 may be one, three, or more. Furthermore, the number of side surface electrodes 22 exposed from each resin side surface 63 may be different for each resin side surface 63.

The semiconductor device and the manufacturing method thereof according to the present disclosure are not limited to the aforementioned embodiments. The specific configuration of each part of the semiconductor device of the present disclosure and the specific processing of each process of the method of manufacturing the semiconductor device of the present disclosure may be changed in design in various ways.

According to the present disclosure in some embodiments, it is possible to facilitate visual confirmation of a bonding state of solder when mounted on a circuit board of an electronic device or the like from above and the side, according to the semiconductor device of the present disclosure. In addition, according to the method of manufacturing a semiconductor device of the present disclosure, it is possible to manufacture a semiconductor device capable of visually confirming a bonding state of solder when it is mounted on a circuit board of an electronic device or the like from above and the side.

While certain embodiments have been described, these embodiments have been presented by way of example only, and are not intended to limit the scope of the disclosures.

Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device, comprising:
   a substrate having a substrate main surface and a substrate rear surface facing opposite sides to each other in a first direction, and a substrate side surface facing in a second direction orthogonal to the first direction;
   a wiring layer having a main surface electrode covering a portion of the substrate main surface, and a side surface electrode connected to the main surface electrode and covering a portion of the substrate side surface;
   a semiconductor element electrically connected to the main surface electrode and mounted on the substrate so as to face the substrate main surface; and
   a sealing resin covering the semiconductor element and the main surface electrode, the sealing resin comprising:
     a resin rear surface, and
     a resin side surface facing in the second direction orthogonal to the first direction,
   wherein the side surface electrode has a side exposed surface exposed from the sealing resin and facing in the same direction as the substrate side surface,
   wherein the side exposed surface and the resin side surface are flush with each other,
   wherein the side surface electrode has a rear exposed surface exposed from the sealing resin and facing in the same direction as the substrate rear surface,
   wherein the rear exposed surface and the substrate rear surface are flush with each other, and
   wherein the resin rear surface and the substrate rear surface are flush with each other.

2. The device of claim 1, further comprising an external plating including a side surface coating part configured to cover the side exposed surface.

3. The device of claim 2, wherein the external plating further includes a rear surface coating part connected to the side surface coating part and configured to cover the rear exposed surface and a portion of the substrate rear surface.

4. The device of claim 2, wherein the external plating includes an Ni layer, a Pd layer, and an Au layer stacked on each other.

5. The device of claim 1, wherein the substrate includes a groove which penetrates from the substrate main surface to the substrate rear surface and is filled with the sealing resin.

6. The device of claim 1, wherein the side surface electrode has a curved edge extending in the first direction as viewed in the second direction.

7. The device of claim 1, wherein the wiring layer includes an underlayer and a plating layer stacked on each other.

8. The device of claim 1, wherein a main component of the wiring layer is copper.

9. The device of claim 1, further comprising a conductive binder interposed between the main surface electrode and the semiconductor element.

10. The device of claim 1, wherein a main component of the substrate includes an intrinsic semiconductor material.

11. The device of claim 10, wherein the intrinsic semiconductor material is silicon.

* * * * *